United States Patent [19]
Withers

[11] Patent Number: 5,818,369
[45] Date of Patent: Oct. 6, 1998

[54] RAPID ENTROPY CODING FOR DATA COMPRESSION OR DECOMPRESSION

[75] Inventor: Wm. Douglas Withers, Crofton, Md.

[73] Assignee: Pegasus Imaging Corporation, Tampa, Fla.

[21] Appl. No.: 613,392

[22] Filed: Mar. 7, 1996

[51] Int. Cl.⁶ .................................................. H03M 7/00
[52] U.S. Cl. ............................................ 341/107; 341/51
[58] Field of Search .............................. 341/107, 67, 58, 341/94, 106

[56] References Cited

U.S. PATENT DOCUMENTS

| 4,286,256 | 8/1981 | Langdon, Jr. et al. ................. 340/347 |
| 4,467,317 | 8/1984 | Langdon, Jr. et al. ................. 340/347 |
| 4,791,403 | 12/1988 | Mitchell et al. ........................... 341/51 |
| 4,891,643 | 1/1990 | Mitchell et al. ......................... 341/107 |
| 4,905,297 | 2/1990 | Langdon, Jr. et al. .................... 382/56 |
| 4,935,882 | 6/1990 | Pennebaker et al. ................... 364/554 |
| 4,973,961 | 11/1990 | Chamzas et al. ......................... 341/51 |
| 5,023,611 | 6/1991 | Chamzas et al. ......................... 341/51 |
| 5,025,258 | 6/1991 | Duttweiler et al. ..................... 341/107 |
| 5,475,388 | 12/1995 | Gormish et al. ......................... 341/107 |

*Primary Examiner*—Brian K. Young
*Attorney, Agent, or Firm*—Langen & Langen

[57] ABSTRACT

A method of manipulating a series of data units comprising distinct data values, including the steps of modelling the occurrence probability of each distinct data value, repeatedly performing the steps of narrowing a manipulation result number into a subinterval determined by the occurrence probability for each successive data value and outputting the more significant digits of the manipulation result number, that can no longer change due to further narrowing, such that the sequence of the output digits are the manipulated data.

15 Claims, 36 Drawing Sheets

```
int bitCount;
int threshold[10] = {0, 1, 2, 4, 8, 16, 32, 54, 128, 256};
int allowable[]   threshold+1; /* For expository purposes only */
FILE *externalIn;
unstigned char internalBuffer;

int decodeBit(){
        if (internalBuffer>=threshold [bitCount] ){
            internalBuffer -= threshold [bitCount];
            if ((--bitCount)<=0)
               decodeImport ();
            return 1;
        }else{
           if ((--bitCount)<=0)
              decodeImport()
           return 0;
        }
} void decodeImport () {
        internalBuffer = fgetc(externalIn)
bitCount += 8;
}
```

*Fig. 2* define JQTS_PER_BYTE 15 unsigned short allowable [2*JQTS_PER_BYTE] = {1, 2, 3, 4, ,7, 10, 14, 20, 28, 41, 59, 85, 123, 177, 256, 371, 536, 776, 1123, 1625, 2353, 3405, 4928, 7132, 10321, 14938, 21619, 31288, 45283};

```
struct{
        unsigned short *threshold;
        short codeLength0;
        short codeLength1;
    } ladder[3] = {{allowable+14, 1, 4},
{allowable+13, 2, 2},}allowable+11, 4, 1}};

unsigned short internalBuffer;
int jotCount;
FILE *externalIn;

int decodeBit(unsigned char rung){
            if (internalBuffer >= ladder [rung] .threshold[jotCount]) {
                internalBuffer -= ladder[rung] .threshold[jotCount]
                if ((jotCount -= ladder [rung] .codeLength1) <= 0)
                   decodeImport()
                return 1;
        }else{
                if ((jotCount -= ladder [rung] .codeLength1) <= 0)
                   decodeImport()
                return 0;
        }
} void decodeImport () {
        jotCount += JOTS_PER_BYTE;
        internalBuffer <<= 8;
        internalBuffer = fgetc(externalIn);
}
```

*Fig. 3*

```
unsigned long min;
int jotCount;
int backlog;
FILE *externalOut;

void encodeBit (unsigned char rung, int bit){
        if (bit){
           /* Encode a 1 */
           min += ladder [rung] .threshold[jotCount];
           jotCount -= ladder[rung] .codeLengt0;
        }else{
           /* Encode a 1 */
           jotCount -= ladder[rung] .codeLength0;
}
if (jotCount<=0)
       encodeExport ();

```
void encodeExport () {
    unsigned long diffBits;

/* First check for bytes becoming postactive;
    diffBits marks differences between max and min consistent values */
    jotCount += JOTS_PER_BYTE;
    diffBits = (min + allowable[jotCount] - 1) ? min;
    switch (backlog) {
    default: /* 2 or greater */
        if (diffBits & 0xFF000000)
            break;
        fputc(min>>24, externalOut)
        while (--backlog > 1)
            fputc((min>>16) & 0xFF,externalOut);
    case 1:
        if (diffBits & 0x00FF0000)
            break;
        fputc((min>>16) & 0xFF, externalOut)
        backlog--;
    case 0:
        if (diffBits & 0x0000FF00)
            break;
        fputc((min>>8) & 0xFF, externalOut)
        backlog--;
    }
}
/* Move a byte from preactive to active. */
if (++backlog>2)
    min = (rain&0xFW000000) i((rain&0x0000FWFF)<< 8);
else
    min <<= 8;
}
```

*Fig. 5*

```
struct {
        unsigned short *threshold;
        short codeLength0;
        short codeLength1;
        unsigned char next 0;
        unsigned char next1;
} ladder[...] = {...};
...
int decodeBit(unsigned char *rung){
        if (internalBuffer >= ladder[*rung] .threshold[jotCount]){
            internalBuffer -= ladder[*rung] .threshold[jotCount];
            if ((jotCount -= ladder[*rung] .codeLength1) <= 0)
                decodeImport();
            *rung = ladder[*rung] .next1;
            return 1;
        }else{
            if ((jotCount -= ladder[*rung] .codeLength0) <= 0)
                decodeImport();
            *rung = ladder[*rung] .next0;
            return 0;
        }
} void encodeBit(unsigned char *rung, int bit){
            if (bit){
                min += ladder [*rung] .threshold [jotCount]
                jotCount -= ladder[*rung] .codeLength1;
                *rung = ladder [*rung] .next1;
            }else{
                jotCount -= ladder[*rung] .codeLeragth0;
                *rung = ladder[*rung] .next0;
            }
            if (jotCount <=0)
                encodeExport ();
}
```

*Fig. 6*

```
/* "elscoder.h": include file for ELS-coder. */ ifnder ELSCODER_H
define ELSCSDER_H
#include <stdio.h>
tinclude <stdio .

typedef unsigned char ElsRung;

/* Initialize decoding. */
void elsDecodeStart (FILE *file);
/* Decode a single bit. */
int elsDecodeBit(ELsRung *rung);
/* Perform consistency check prior to ending decoding. */
int elsDecode0k(void)
/* Conclude decoding. */
void elsDecodeEnd (void);
/* Initialize encoding. */
void elsEncodeStart(FILE *file);
/* Encode a single bit. */
void els/EncodeBit (ElsRung *rung, int bit);
*/ Conclude encoding. */
void elsEncodeEnd (void);
# endif /* nder ELSCODER_H */
```

```c
/* "elscoder.c": data and procedures for ELS-coder. */ define ALACRITOUS
include "elscoder.h"
#include <stdio.h>
include <stdlib.h> typedef unsigned char uchar;
typedef unsigned short ushort;
typedef unsigned long ulong;

define JOTS_PER_BYTE 754 static  ushort allowable[2*JOTS_PER_BYTE]     = {
                 1,     2,     2,     2,     2,     2,     2,     2,     2,     2,     2,     2,
                 2,     2,     2,     2,     2,     2,     2,     2,     2,     2,     2,     2,
                 2,     2,     2,     2,     2,     2,     2,     2,     2,     2,     2,     2,
                 2,     2,     2,     2,     2,     2,     2,     2,     2,     2,     2,     2,
                 2,     2,     2,     2,     2,     2,     2,     2,     2,     2,     2,     2,
                 2,     2,     2,     2,     2,     2,     2,     2,     2,     2,     2,     2,
                 2,     2,     2,     2,     2,     2,     2,     2,     2,     2,     2,     2,
                 2,     2,     2,     2,     2,     2,     2,     2,     2,     2,     2,     3,
                 3,     3,     3,     3,     3,     3,     3,     3,     3,     3,     3,     3,
                 3,     3,     3,     3,     3,     3,     3,     3,     3,     3,     3,     3,
                 3,     3,     3,     3,     3,     3,     3,     3,     3,     3,     3,     3,
                 3,     3,     3,     3,     3,     3,     3,     3,     3,     3,     3,     3,
                 3,     3,     3,     3,     3,     3,     4,     4,     4,     4,     4,     4,
                 4,     4,     4,     4,     4,     4,     4,     4,     4,     4,     4,     4,
                 4,     4,     4,     4,     4,     4,     4,     4,     4,     4,     4,     4,
                 4,     4,     4,     4,     4,     4,     4,     4,     5,     5,     5,     5,
                 5,     5,     5,     5,     5,     5,     5,     5,     5,     5,     5,     5,
                 5,     5,     5,     5,     5,     5,     5,     5,     5,     5,     5,     5,
                 5,     5,     5,     6,     6,     6,     6,     6,     6,     6,     6,     6,
                 6,     6,     6,     6,     6,     6,     6,     6,     6,     6,     6,     6,
                 6,     6,     6,     6,     7,     7,     7,     7,     7,     7,     7,     7,
                 7,     7,     7,     7,     7,     7,     7,     7,     7,     7,     7,     7,
                 7,     8,     8,     8,     8,     8,     8,     8,     8,     8,     8,     8,
                 8,     8,     8,     8,     8,     8,     8,     9,     9,     9,     9,     9,
                 9,     9,     9,     9,     9,     9,     9,     9,     9,     9,     9,     10,
                 10,    10,    10,    10,    10,    10,    10,    10,    10,    10,    10,    10,
                 10,    10,    11,    11,    11,    11,    11,    11,    11,    11,    11,    11,
                 11,    11,    11,    12,    12,    12,    12,    12,    12,    12,    12,    12,
                 12,    12,    13,    13,    13,    13,    13,    13,    13,    13,    13,    13,
                 13,    14,    14,    14,    14,    14,    14,    14,    14,    14,    14,    15,
                 15,    15,    15,    15,    15,    15,    15,    15,    15,    16,    16,    16,
```

*Fig. 15*

| 16, | 16, | 16, | 16, | 16, | 16, | 17, | 17, | 17, | 17, | 17, | 17, |
|---|---|---|---|---|---|---|---|---|---|---|---|
| 18, | 18, | 18, | 18, | 18, | 18, | 18, | 18, | 19, | 19, | 19, | 19, |
| 19, | 19, | 19, | 20, | 20, | 20, | 20, | 20, | 20, | 20, | 20, | 20, |
| 21, | 21, | 21, | 21, | 21, | 21, | 22, | 22, | 22, | 22, | 22, | 22, |
| 22, | 23, | 23, | 23, | 23, | 23, | 23, | 24, | 24, | 24, | 24, | 24, |
| 24, | 25, | 25, | 25, | 25, | 25, | 26, | 26, | 26, | 26, | 26, | 26, |
| 27, | 27, | 27, | 27, | 27, | 28, | 28, | 28, | 28, | 28, | 29, | 29, |
| 29, | 29, | 30, | 30, | 30, | 30, | 30, | 31, | 31, | 31, | 31, | 32, |
| 32, | 32, | 32, | 32, | 33, | 33, | 33, | 33, | 34, | 34, | 34, | 34, |
| 35, | 35, | 35, | 35, | 36, | 36, | 36, | 36, | 37, | 37, | 37, | 38, |
| 38, | 38, | 38, | 39, | 39, | 39, | 39, | 40, | 40, | 40, | 41, | 41, |
| 41, | 42, | 42, | 42, | 42, | 43, | 43, | 43, | 44, | 44, | 44, | 45, |
| 45, | 45, | 46, | 46, | 46, | 47, | 47, | 47, | 48, | 48, | 48, | 49, |
| 49, | 49, | 50, | 50, | 51, | 51, | 51, | 52, | 52, | 52, | 53, | 53, |
| 54, | 54, | 54, | 55, | 55, | 56, | 56, | 56, | 57, | 57, | 58, | 58, |
| 58, | 59, | 59, | 60, | 60, | 61, | 61, | 62, | 62, | 62, | 63, | 63, |
| 64, | 64, | 65, | 65, | 66, | 66, | 67, | 67, | 68, | 68, | 69, | 69, |
| 70, | 70, | 71, | 71, | 72, | 72, | 73, | 73, | 74, | 74, | 75, | 75, |
| 76, | 77, | 77, | 78, | 78, | 79, | 79, | 80, | 81, | 81, | 82, | 82, |
| 83, | 84, | 84, | 85, | 85, | 86, | 87, | 87, | 88, | 89, | 89, | 90, |
| 91, | 91, | 92, | 93, | 93, | 94, | 95, | 95, | 96, | 97, | 97, | 98, |
| 99, | 100, | 100, | 101, | 102, | 103, | 103, | 104, | 105, | 106, | 106, | 107, |
| 108, | 109, | 110, | 110, | 111, | 112, | 113, | 114, | 114, | 115, | 116, | 117, |
| 118, | 119, | 120, | 121, | 121, | 122, | 123, | 124, | 125, | 126, | 127, | 128, |
| 129, | 130, | 131, | 132, | 133, | 134, | 135, | 136, | 137, | 138, | 139, | 140, |
| 141, | 142, | 143, | 144, | 145, | 146, | 147, | 148, | 149, | 150, | 151, | 152, |
| 153, | 155, | 156, | 157, | 158, | 159, | 160, | 162, | 163, | 164, | 165, | 166, |
| 168, | 169, | 170, | 171, | 173, | 174, | 175, | 176, | 178, | 179, | 180, | 182, |
| 183, | 184, | 186, | 187, | 188, | 190, | 191, | 193, | 194, | 196, | 197, | 198, |
| 200, | 201, | 203, | 204, | 206, | 207, | 209, | 210, | 212, | 214, | 215, | 217, |
| 218, | 220, | 221, | 223, | 225, | 226, | 228, | 230, | 231, | 233, | 235, | 237, |
| 238, | 240, | 242, | 244, | 245, | 247, | 249, | 251, | 253, | 255, | 256, | 258, |
| 260, | 262, | 264, | 266, | 268, | 270, | 272, | 274, | 276, | 278, | 280, | 282, |
| 284, | 286, | 288, | 290, | 292, | 294, | 297, | 299, | 301, | 303, | 305, | 308, |
| 310, | 312, | 315, | 317, | 319, | 322, | 324, | 326, | 329, | 331, | 334, | 336, |
| 339, | 341, | 344, | 346, | 349, | 351, | 354, | 356, | 359, | 362, | 364, | 367, |
| 370, | 373, | 375, | 378, | 381, | 384, | 386, | 389, | 392, | 395, | 398, | 401, |
| 404, | 407, | 410, | 413, | 416, | 419, | 422, | 425, | 428, | 432, | 435, | 438, |
| 441, | 444, | 448, | 451, | 454, | 458, | 461, | 464, | 468, | 471, | 475, | 478, |
| 482, | 485, | 489, | 493, | 496, | 500, | 504, | 507, | 511, | 515, | 519, | 522, |
| 526, | 530, | 534, | 538, | 542, | 546, | 550, | 554, | 558, | 562, | 566, | 571, |
| 575, | 579, | 583, | 588, | 592, | 596, | 601, | 605, | 610, | 614, | 619, | 623, |
| 628, | 633, | 637, | 642, | 647, | 651, | 656, | 661, | 666, | 671, | 676, | 681, |
| 686, | 691, | 696, | 701, | 706, | 712, | 717, | 722, | 727, | 733, | 738, | 744, |
| 749, | 755, | 760, | 766, | 771, | 777, | 783, | 789, | 795, | 800, | 806, | 812, |
| 818, | 824, | 830, | 837, | 843, | 849, | 855, | 861, | 868, | 874, | 881, | 887, |
| 894, | 900, | 907, | 914, | 920, | 927, | 934, | 941, | 948, | 955, | 962, | 969, |

```
61791, 62248, 62707, 63170, 63636, 64106, 64579, 65056 };
static struct
        {
        ushort *threshold;
        short codeLength0;
        short codeLength1;
        uchar next0;
        uchar next1;
        } ladder [256] = {
#ifdef ALACRITOUS
        /*  0:0.50000    */ {allowable+ 665,  89, 101,  1,  2},
        /*  1:0.33333    */ {allowable+ 692,  62, 138,  3,  4},
        /*  2:0.66667    */ {allowable+ 616, 138,  62,  5,  6},
        /*  3:0.23667    */ {allowable+ 716,  38, 194,  7,  8},
        /*  4:0.52667    */ {allowable+ 653, 101,  89,  9, 10},
        /*  5:0.47333    */ {allowable+ 665,  89, 101, 11, 12},
        /*  6:0.76333    */ {allowable+ 560, 194,  38, 13, 14},
        /*  7:0.17829    */ {allowable+ 727,  27, 236, 15, 16},
        /*  8:0.42496    */ {allowable+ 679,  75, 118, 17, 18},
        /*  9:0.39676    */ {allowable+ 689,  65, 133, 19, 20},
        /* 10:0.64342    */ {allowable+ 616, 138,  62, 21, 22},
        /* 11:0.35658    */ {allowable+ 692,  62, 138, 23, 24},
        /* 12:0.60324    */ {allowable+ 621, 133,  65, 25, 26},
        /* 13:0.57604    */ {allowable+ 636, 118,  75, 27, 28},
        /* 14:0.82171    */ {allowable+ 518, 236,  27, 29, 30},
        /* 15:0.14204    */ {allowable+ 732,  22, 262, 31, 32},
        /* 16:0.34537    */ {allowable+ 592,  62, 138, 33, 34},
        /* 17:0.33855    */ {allowable+ 692,  62, 138, 35, 36},
        /* 18:0.64188    */ {allowable+ 646, 108,  83, 37, 38},
        /* 19:0.31608    */ {allowable+  04,  50, 162, 39, 40},
        /* 20:0.51942    */ {allowable+ 653, 101,  89, 41, 42},
        /* 21:0.51259    */ {allowable+ 553, 101,  89, 43, 44},
        /* 22:0.71593    */ {allowable+ 580, 174,  45, 45, 46},
        /* 23:0.28407    */ {allowable+ 709,  45, 174, 47, 48},
        /* 24:0,4874     */ {allowable+ 665,  89, 101, 49, 50},
        /* 25:0.48068    */ {allowable+ 665,  89, 101, 51, 52},
        /* 26:0.68392    */ {allowable+ 592, 162,  50, 53, 54},
        /* 27:0.45812    */ {allowable+ 671,  83, 108, 55, 56},
        /* 28:0.66145    */ {allowable+ 616, 188,  62, 57, 58},
        /* 29:0.65463    */ {allowable+ 615, 138,  62, 59, 60},
        /* 30:0.55796    */ {allowable+ 492, 262,  22, 61, 62},
        /* 31:0.11931    */ {allowable+ 737,  17, 295, 63, 64},
        /* 32:0.27931    */ {allowable+ 709,  45, 174, 58, 56},
        /* 33:0.29011    */ {allowable+ 709,  45, 174, 67, 68},
        /* 34:0.45011    */ {allowable+ 671,  83, 108, 69, 70},
        /* 36:0.28438    */ {allowable+ 709,  45, 174, 71, 72},
```

Fig. 18

```
/*    36:0.44438    */ {allowable+ 679, 78,  118, 73,  74},
/*    37:0.45618    */ {allowable+ 671, 83,  108, 75,  76},
/*    38:0.61518    */ {allowable+ 621, 133, 65, 77,  78},
/*    39:0.2655$    */ {allowable+ 713, 41,  185, 79,  80},
/*    40:0.4255$    */ {allowable+ 679, 75,  118, 81,  82},
/*    41:0.43631    */ {allowable+ 679, 75,  118, 83,  84},
/*    42:0.59631    */ {allowable+ 636, 118, 75, 85,  86},
/*    43:0.43058    */ {allowable+ 679, 75,  118, 87,  88},
/*    44:0.59058    */ {allowable+ 636, 118, 75, 89,  90},
/*    45:0.50138    */ {allowable+ 621, 133, 65, 91,  92},
/*    46:0.76138    */ {allowable+ 560, 194, 38, 93,  94},
/*    47:0.23862    */ {allowable+ 716, 38,  194, 95,  96},
/*    48:0.39862    */ {allowable+ 689, 68,  133, 97,  98},
/*    49:0.40942    */ {allowable+ 679, 75,  118, 99, 100},
/*    50:0.56942    */ {allowable+ 636, 118, 75, 101, 102},
/*    51:0.40369    */ {allowable+ 679, 75,  118, 103, 104},
/*    52:0.56369    */ {allowable+ 636, 118, 75, 105, 106},
/*    53:0.57449    */ {allowable+ 636, 118, 75, 107, 108},
/*    54:0.73449    */ {allowable+ 569, 185, 41, 109, 110},
/*    55:0.38482    */ {allowable+ 689, 65,  133, 111, 112},
/*    56:0.54482    */ {allowable+ 646, 108, 83, 113, 114},
/*    57:0.55562    */ {allowable+ 636, 118, 75, 115, 116},
/*    58:0.71562    */ {allowable+ 580, 174, 45, 117, 118},
/*    59:0.54989    */ {allowable+ 646, 108, 83, 119, 120},
/*    60:0.70989    */ {allowable+ 580, 174, 45, 121, 122},
/*    61:0.72069    */ {allowable+ 580, 174, 45, 123, 124},
/*    62:0.88069    */ {allowable+ 459, 295, 17, 125, 126},
/*    63:0.10539    */ {allowable+ 738, 16,  303, 152, 161},
/*    64:0.22206    */ {allowable+ 721, 33,  211, 165, 172},
/*    65:0.24672    */ {allowable+ 716, 38,  194, 167, 174},
/*    66:0.36339    */ {allowable+ 692, 62,  138, 177, 183},
/*    67:0.25626    */ {allowable+ 713, 41,  185, 168, 175},
/*    68:0.37293    */ {allowable+ 692, 62,  138, 178, 184},
/*    69:0.39760    */ {allowable+ 689, 65,  133, 180, 186},
/*    70:0.51426    */ {allowable+ 653, 101, 89, 189, 195},
/*    71:0.25120    */ {allowable+ 713, 41,  185, 168, 174},
/*    72:0.36787    */ {allowable+ 692, 62,  138, 177, 183},
/*    73:0.39254    */ {allowable+ 689, 65,  133, 179, 185},
/*    74:0.50920    */ {allowable+ 653, 101, 89, 188, 194},
/*    75:0.40208    */ {allowable+ 679, 75,  118, 180, 186},
/*    76:0.51874    */ {allowable+ 653, 101, 89, 189, 195},
/*    77:0.54341    */ {allowable+ 646, 108, 83, 191, 197},
/*    78:0.66008    */ {allowable+ 616, 138, 62, 200, 206},
/*    79:0.23453    */ {allowable+ 716, 38,  194, 166, 173},
/*    80:0.35120    */ {allowable+ 692, 62,  138, 176, 182},
/*    81:0.37587    */ {allowable+ 689, 65,  133, 178, 184},
/*    82:0.49253    */ {allowable+ 665, 89,  101, 187, 193},
```

*Fig. 19*

```
/*       83:0.38541    */ {allowable+ 689,  65,133,   179,   185},
/*       84:0.50207    */ {allowable+ 653, 101,  89,   188,   194},
/*       85:0.52674    */ {allowable+ 653, 101,  89,   190,   196},
/*       86:0.84341    */ {allowable+ 616, 138,  62,   198,   205},
/*       87:0.38034    */ {allowable+ 689,  65,133,   178,   184},
/*       88:0.49701    */ {allowable+ 665,  89,101,   187,   193},
/*       89:0.52168    */ {allowable+ 653, 101,  89,   189,   195},
/*       90:0.63834    */ {allowable+ 616, 138,  62,   198,   204},
/*       91:0.53122    */ {allowable+ 653, 101,  89,   190,   196},
/*       92:0.64788    */ {allowable+ 616, 138,  62,   199,   205},
/*       93:0.67255    */ {allowable+ 592, 162,  50,   201,   207},
/*       94:0.78922    */ {allowable+ 543, 211,  33,   210,   217},
/*       95:0.21078    */ {allowable+ 721,  33,211,   164,   171},
/*       96:0.32745    */ {allowable+ 704,  50,162,   174,   180},
/*       97:0.35212    */ {allowable+ 692,  62,138,   176,   182},
/*       98:0.46878    */ {allowable+ 565,  89,101,   185,   191},
/*       99:0.36166    */ {allowable+ 692,  62,138,   177,   183},
/*      100:0.47832    */ {allowable+ 655,  89,101,   186,   192},
/*      101:0.50299    */ {allowable+ 653, 101,  89,   188,   194},
/*      102:0.61966    */ {allowable+ 621, 133,  65,   197,   203},
/*      103:0.35659    */ {allowable+ 692,  62,138,   176,   183},
/*      104:0.47326    */ {allowable+ 665,  89,101,   185,   191},
/*      105:0.49793    */ {allowable+ 665,  89,101,   187,   193},
/*      106:0.61459    */ {allowable+ 621, 133,  65,   196,   202},
/*      107:0.50747    */ {allowable+ 653, 101,  89,   188,   194},
/*      108:0.62413    */ {allowable+ 621, 133,  65,   197,   203},
/*      109:0.64880    */ {allowable+ 616, 138,  62,   199,   205},
/*      110:0.76547    */ {allowable+ 560, 194,  38,   208,   215},
/*      111:0.33992    */ {allowable+ 692,  62,138,   175,   181},
/*      112:0.45559    */ {allowable+ 671,  83,108,   184,   190},
/*      113:0.48126    */ {allowable+ 665,  89,101,   186,   192},
/*      114:0.59792    */ {allowable+ 636, 118,  75,   195,   201},
/*      115:0.49080    */ {allowable+ 665,  89,101,   187,   193},
/*      116:0.60746    */ {allowable+ 621, 133,  68,   196,   202},
/*      117:0.63213    */ {allowable+ 616, 138,  62,   198,   204},
/*      118:0.74880    */ {allowable+ 569, 185,  41,   207,   213},
/*      119:0.48674    */ {allowable+ 665,  89,101,   186,   192},
/*      120:0.60240    */ {allowable+ 621, 133,  65,   195,   201},
/*      121:0.62707    */ {allowable+ 616, 138,  62,   197,   203},
/*      122:0.74374    */ {allowable+ 569, 185,  41,   206,   213},
/*      123:0.63661    */ {allowable+ 616, 138,  62,   198,   204},
/*      124:0.76328    */ {allowable+ 660, 194,  38,   207,   214},
/*      125:0.77794    */ {allowable+ 543, 211,  33,   209,   216},
/*      126:0.89461    */ {allowable+ 461, 303,  16,   220,   229},
/*      127:0.00004    */ {allowable+ 753,   1,716,   127,   141},
/*      128:0.00034    */ {allowable+ 753,   1,716,   127,   141},
/*      129:0.00094    */ {allowable+ 753,   1,716,   128,   141},
```

*Fig. 20*

```
/*   130:0.00184   */ {allowable+ 753,   1, 716, 129, 141},
/*   131:0.00305   */ {allowable+ 753,   1, 716, 130, 141},
/*   132:0.00455   */ {allowable+ 753,   1, 716, 131, 142},
/*   133:0.00635   */ {allowable+ 753,   1, 716, 132, 142},
/*   134:0.00845   */ {allowable+ 753,   1, 716, 133, 143},
/*   135:0.01084   */ {allowable+ 752,   2, 606, 134, 143},
/*   136:0.01353   */ {allowable+ 752,   2, 606, 135, 144},
/*   137:0.01651   */ {allowable+ 751,   3, 538, 136, 144},
/*   138:0.01978   */ {allowable+ 751,   3, 538, 137, 145},
/*   139:0.02335   */ {allowable+ 750,   4, 496, 138, 145},
/*   140:0.02720   */ {allowable+ 750,   4, 496, 139, 146},
/*   141:0.03133   */ {allowable+ 749,   6, 462, 140, 147},
/*   142:0.03575   */ {allowable+ 749,   5, 462, 141, 147},
/*   143:0.04044   */ {allowable+ 748,   6, 436, 142, 148},
/*   144:0.04542   */ {allowable+ 748,   6, 436, 143, 149},
/*   145:0.05066   */ {allowable+ 747,   7, 415, 144, 150},
/*   146:0.05618   */ {allowable+ 745,   9, 380, 145, 151},
/*   147:0.06196   */ {allowable+ 745,   9, 380, 146, 151},
/*   148:0.06801   */ {allowable+ 744,  10, 366, 147, 152},
/*   149:0.07432   */ {allowable+ 743,  11, 353, 148, 153},
/*   150:0.08089   */ {allowable+ 741,  13, 330, 149, 154},
/*   151:0.08771   */ {allowable+ 741,  13, 330, 150, 155},
/*   152:0.09477   */ {allowable+ 741,  13, 330, 151, 156},
/*   153:0.10208   */ {allowable+ 738,  16, 303, 152, 156},
/*   154:0.10963   */ {allowable+ 738,  16, 303, 153, 157},
/*   155:0.11742   */ {allowable+ 737,  17, 295, 154, 158},
/*   156:0.12543   */ {allowable+ 736,  18, 288, 155, 159},
/*   157:0.13367   */ {allowable+ 732,  22, 262, 156, 160},
/*   158:0.14213   */ {allowable+ 732,  22, 262, 157, 161},
/*   169:0.16081   */ {allowable+ 731,  23, 256, 158, 162},
/*   160:0.15970   */ {allowable+ 731,  23, 256, 159, 163},
/*   161:0.16879   */ {allowable+ 727,  27, 236, 160, 164},
/*   162:0.17808   */ {allowable+ 727,  27, 236, 161, 165},
/*   163:0.18757   */ {allowable+ 727,  27, 236, 162, 165},
/*   164:0.19724   */ {allowable+ 722,  32, 215, 163, 166},
/*   165:0.20710   */ {allowable+ 721,  33, 211, 164, 167},
/*   166:0.21713   */ {allowable+ 721,  33, 211, 165, 168},
/*   167:0.22734   */ {allowable+ 716,  38, 194, 166, 169},
/*   168:0.23771   */ {allowable+ 716,  38, 194, 167, 170},
/*   169:0.24823   */ {allowable+ 716,  38, 194, 168, 171},
/*   170:0.26891   */ {allowable+ 713,  41, 185, 169, 172},
/*   171:0.26973   */ {allowable+ 709,  46, 174, 170, 173},
/*   172:0.28069   */ {allowable+ 709,  46, 174, 171, 174},
/*   173:0.29179   */ {allowable+ 709,  46, 174, 172, 175},
/*   174:0.30300   */ {allowable+ 704,  60, 162, 173, 176},
/*   175:0.31434   */ {allowable+ 704,  50, 162, 174, 177},
/*   176:0.32679   */ {allowable+ 704,  50, 162, 175, 178},
```

*Fig. 21*

```
/* 177:0.33734      */ {allowable+ 692,   62, 138, 176, 179},
/* 178:0.34900      */ {allowable+ 692,   62, 138, 177, 180},
/* 179:0.36074      */ {allowable+ 692,   62, 138, 178, 181},
/* 180:0.37257      */ {allowable+ 692,   62, 138, 179, 182},
/* 181:0.38447      */ {allowable+ 689,   65, 133, 180, 183},
/* 182:0.39644 */ {allowable+ 689,        65, 133, 181, 184},
/* 183:0.40848      */ {allowable+ 679,   75, 118, 182, 184},
/* 184:0.42067      */ {allowable+ 679,   75, 118, 183, 185},
/* 185:0.43271      */ {allowable+ 679,   75, 118, 184, 186},
/* 186:0.44489      */ {allowable+ 671,   83, 108, 185, 187},
/* 187:0.45710 */ {allowable+ 671,        83, 108, 186, 188},
/* 188:0.46934      */ {allowable+ 666,   89, 101, 187, 189},
/* 189:0.48160      */ {allowable+ 665,   89, 101, 188, 190},
/* 190:0.49386      */ {allowable+ 665,   89, 101, 189, 191},
/* 191:0.50614      */ {allowable+ 653,  101, 89, 190, 192},
/* 192:0.51840      */ {allowable+ 653,  101, 59, 191, 193},
/* 193:0.53066      */ {allowable+ 653,  101, 89, 192, 194},
/* 194:0.54290      */ {allowable+ 646,  108, 83, 193, 195},
/* 195:0.55511      */ {allowable+ 646,  108, 83, 194, 196},
/* 196:0.56729 */ {allowable+ 636,       118, 75, 195, 197},
/* 197:0.57943 */ {allowable+ 636,       118, 75, 196, 198},
/* 198:0.59152      */ {allowable+ 636,  118, 75, 197, 199},
/* 199:0.60366      */ {allowable+ 621,  133, 63, 197, 200},
/* 200:0.61553      */ {allowable+ 621,  133, 65, 198, 201},
/* 201:0.62743      */ {allowable+ 616,  138, 62, 199, 202},
/* 202:0.53926      */ {allowable+ 616,  138, 62, 200, 203},
/* 203:0.65100      */ {allowable+ 616,  138, 62, 201, 204},
/* 204:0.66266 */ {allowable+ 616,       138, 62, 202, 205},
/* 205:0.67421      */ {allowable+ 592,  162, 50, 203, 206},
/* 206:0.68566      */ {allowable+ 592,  162, 50, 204, 207},
/* 207:0.69700      */ {allowable+ 592,  162, 50, 205, 208},
/* 208:0.70821      */ {allowable+ 580,  174, 45, 206, 209},
/* 209:0.71931      */ {allowable+ 580,  174, 45, 207, 210},
/* 210:0.73027      */ {allowable+ 580,  174, 45, 208, 211},
/* 211:0.74109      */ {allowable+ 569,  185, 41, 209, 212},
/* 212:0.75177      */ {allowable+ 560,  194, 38, 210, 213},
/* 213:0.76229      */ {allowable+ 560,  194, 38, 211, 214},
/* 214:0.77266      */ {allowable+ 560,  194, 38, 212, 215},
/* 215:0.78287      */ {allowable+ 543,  211, 33, 213, 216},
/* 216:0.79290      */ {allowable+ 543,  211, 33, 214, 217},
/* 217:0.80276      */ {allowable+ 539,  216, 32, 216, 218},
/* 218:0.31243      */ {allowable+ 518,  236, 27, 216, 219},
/* 219:0.82192      */ {allowable+ 518,  236, 27, 216, 220},
/* 220:0.83121      */ {allowable+ 618,  236, 27, 217, 221},
/* 221:0.84030      */ {allowable+ 498,  256, 23, 218, 222},
/* 222:0.34919      */ {allowable+ 498,  256, 23, 219, 223},
/* 223:0,85787      */ {allowable+ 492,  262, 22, 220, 224},
```

*Fig. 22*

```
/*      224:0.86633    */ {allowable+ 492, 262,22, 221, 225},
/*      225:0.87457    */ {allowable+ 466, 288,18, 222, 226},
/*      226:0.88258    */ {allowable+ 459, 295,17, 223, 227},
/*      227:0.89037    */ {allowable+ 461, 303,16, 224, 228},
/*      228:0.89792    */ {allowable+ 46ú, 303,16, 225, 229},
/*      229:0.90523    */ {allowable+ 424, 330,13, 225, 230},
/*      230:0.91229    */ {allowable+ 424, 330,13, 226, 231},
/*      231:0.91911    */ {allowable+ 424, 330,13, 227, 232},
/*      232:0.92568    */ {allowable+ 40ú, 353,11, 228, 233},
/*      233:0.93199    */ {allowable+ 388, 366,10, 229, 234},
/*      234:0.93804    */ {allowable+ 374, 380,9, 230, 235},
/*      235:0.94382    */ {allowable+ 374, 380,9, 230, 236},
/*      236:0.94934    */ {allowable+ 339, 415,7, 231, 237},
/*      237:0.96458    */ {allowable+ 318, 436,6, 232, 238},
/*      238:0.95956    */ {allowable+ 318, 436,6, 233, 239},
/*      239:0.96425    */ {allowable+ 292, 482,5, 234, 240},
/*      240:0.96867    */ {allowable+ 292, 462,5, 234, 241},
/*      241:0.97280    */ {allowable+ 258, 496,4, 235, 242},
/*      242:0.97666    */ {allowable+ 268, 496,4, 236, 243},
/*      243:0.98022    */ {allowable+ 216, 638,3, 236, 244},
/*      244:0.98349    */ {allowable+ 216, 538,3, 237, 245},
/*      245:0.98647    */ {allowable+ 148, 606,2, 237, 246},
/*      246:0.98916    */ {allowable+ 148, 606,2, 238, 247},
/*      247:0.99155    */ {allowable+ 38, 716,1, 238, 248},
/*      248:0.99365    */ {allowable+ 38, 716,1, 239, 249},
/*      249:0,99546    */ {allowable+ 38, 716,1, 239, 250},
/*      250:0.99696    */ {allowable+ 38, 716,1, 240, 251},
/*      261:0.99816    */ {allowable+ 38, 716,1, 240, 252},
/*      252:0.99906    */ {allowable+ 38, 716,1, 240, 253},
/*      253:0.99966    */ {allowable+ 38, 716,1, 240, 254},
/*      264:0.99996    */ {allowable+ 38, 716,1, 240, 254},
#else
/*      0:0.50000      */ {allowable+ 665, 89,101,  1,  2},
/*      1:0.32281      */ {allowable+ 704, 50,162,  3,  4},
/*      2:0.65614      */ {allowable+ 616, 138, 62,  5,  6},
/*      3:0.14678      */ {allowable+ 731,  23, 256, 7,  8},
/*      4:0.43678      */ {allowable+ 679, 75, 118, 9, 10},
/*      5:0.62228      */ {allowable+ 653, 101, 89, 11, 12},
/*      6:0.81228      */ {allowable+ 518, 236, 27, 13, 14},
/*      7:0.03670      */ {allowable+ 749,  5, 462, 15, 16},
/*      8:0.20427      */ {allowable+ 721, 33, 211, 17,18},
/*      9:0.30122      */ {allowable+ 704, 60, 162, 19, 20},
/*      10:0.54788     */ {allowable+ 646, 108, 83, 21, 22},
/*      11:0.40126     */ {allowable+ 679, 75, 118, 23, 24},
/*      12:0.64791     */ {allowable+ 616, 138, 62, 25, 26},
/*      13:0.73060     */ {allowable+ 580, 174, 45, 27, 28},
/*      14:0.97727     */ {allowable+ 216, 538,  3, 29, 30},
```

*Fig. 23*

```
/*    15:0.00917    */ {allowable+  752,   2,    605,   31,   32},
/*    16:0.04461    */ (allowable+  748,   6,    436,   33,   34},
/*    17:0.07792    */ {allowable+  743,   11,   363,   36,   35},
/*    18:0.28125    */ {allowable+  709,   46,   174,   37,   38},
/*    19:0.18273    */ {allowable+  727,   27,   236,   39,   40},
/*    20:0.38606    */ {allowable+  689,   65,   133,   41,   42},
/*    21:0.44983    */ {allowable+  671,   83,   108,   43,   44},
/*    22:0.66317    */ {allowable+  616,   138,  62,    46,   46},
/*    23:0.29689    */ {allowable+  704,   60,   162,   47,   48},
/*    24:0.50022    */ {allowable+  663,   101,  89,    49,   60},
/*    26:0.55589    */ {allowable+  636,   118,  75,    51,   52},
/*    26:0.75922    */ {allowable+  560,   194,  38,    53,   54},
/*    27:0.64678    */ {allowable+  616,   138,  62,    66,   66},
/*    28:0.85011    */ {allowable+  498,   266,  23,    57,   58},
/*    29:0.97318    */ {allowable+  268,   496,  4,     59,   60},
/*    30:0.99432    */ {allowable+  38,    716,  1,     51,   62},
/*    31:0.00229    */ {allowable+  763,   1,    716,   63,   64},
/*    32:0.01163    */ {allowable+  752,   2,    606,   66,   66},
/*    33:0.01113    */ {allowable+  752,   2,    606,   67,   68},
/*    34:0.06438    */ {allowable+  746,   8,    397,   59,   70},
/*    35:0.01948    */ {allowable+  751,   3,    638,   71,   72},
/*    36:0.09947    */ {allowable+  741,   13,   330,   73,   74},
/*    37:0.18492    */ {allowable+  727,   27,   236,   76,   76},
/*    38:0.34492    */ {allowable+  692,   62,   13,    77,   78},
/*    39:0.07689    */ {allowable+  743,   11,   353,   79,   80},
/*    40:0.23689    */ {allowable+  716,   38,   194,   81,   82},
/*    41:0.29603    */ {allowable+  704,   50,   162,   83,   84},
/*    42:0.46603    */ {allowable+  671,   83,   108,   86,   86},
/*    43:0.36736    */ {allowable+  692,   62,   138,   87,   88},
/*    44:0.52736    */ {allowable+  663,   101,  89,    89,   90},
/"    46:0.57984    */ {allowable+  636,   118,  76,    91,   92},
/*    46:0.73984    */ {allowable+  569,   186,  41,    93,   941,
/*    47:0.20446    */ {allowable+  721,   33,   211,   95,   96},
/*    48:0.36446    */ {allowable+  692,   62,   138,   97,   98},
/*    49:0.42624    */ {allowable+  679,   76,   118,   99,   100},
/*    60:0.68624    */ {allowable+  636,   118,  75,    101,  102},
/*    51:0.48600    */ {allowable+  666,   89,   101,   103,  104},
/*    52:0.64600    */ {allowable+  616,   138,  62,    106,  106},
/*    53:0.69813    */ {allowable+  692,   162,  50,    107,  108},
/*    54:0.85813    */ {allowable+  492,   262,  22,    109,  110},
/*    56:0.67466    */ {allowable+  636,   118,  75,    111,  112},
/*    66:0.73466    */ {allowable+  669,   186,  41,    113,  114},
/*    57:0.79610    */ {allowable+  543,   211,  33,    119,  116},
/*    68:0.95610    */ {allowable+  318,   436,  6,     117,  118},
/*    69:0.96730    */ {allowable+  292,   462,  6,     119,  120},
/*    60:0.99330    */ {allowable+  38,    716,  1,     121,  122},
/*    61:0.99328    */ {allowable+  38,    716,  1,     123,  124},
```

Fig. 24

```
/*   62:0.99858   */ {allowable+   38, 716,  1, 125, 126},
/*   63:0.00057   */ {allowable+  753,  1, 716, 127, 130},
/*   64:0.00334   */ {allowable+  753, 1, 716, 129, 132},
/*   65:0.00291   */ {allowable+  753,  1,  716, 129, 132},
/*   66:0.0ú407   */ {allowable+  752, 2,  606, 131, 137},
/*   67:0.00278   */ {allowable+  753,  1,  716, 129, 132},
/*   68:0.01358   */ {allowable+  752, 2,  606, 131, 137},
/*   69:0.01359   */ {allowable+  752, 2,  606, 131, 137},
/*   70:0.06867   */ {allowable+  744,10, 366, 137, 151},
/*   71:0.00487   */ {allowable+  753, 1, 716, 129, 133},
/*   72:0.02358   */ fallowable+  750, 4,  496, 133, 141},
/*   73:0.01347   */ {allowable+  752, 2,  606, 131, 137},
/*   74:0.13014   */ {allowable+  736, 18,288, 150, 189},
/*   75:0.10736   */ {allowable+  738,16, 303, 146, 157},
/*   76:0.22403   */ {allowable+  721, 33,211, 162, 169},
/*   77:0.28197   */ {allowable+  709, 45,174, 168, 175},
/*   78:0.39863   */ {allowable+  689,65, 133, 179, 184},
/*   79:0.01922   */ {allowable+  751, 3, 538, 132, 139},
/*   80:0.09845   */ {allowable+  741,13, 330, 144, 155},
/*   81:0.16535   */ {allowable+  731,23, 256, 155, 163},
/*   82:0.28202   */ {allowable+  709,45,174, 168, 175},
/*   83:0.22875   */ {allowable+  716,38,194, 163, 170},
/*   84:0.34541   */ {allowable+  692,62,138, 174, 181},
/*   85:0.39516   */ {allowable+  689,65,133, 178, 184},
/*   86:0.51183   */ {allowable+  653,101,89, 189, 195},
/*   87:0.30158   */ {allowable+  704,50,162, 170, 177},
/*   88:0.41825   */ {allowable+  679,75,118, 181, 187},
/*   89:0.46952   */ {allowable+  665,89,101, 185, 191},
/*   90:0.58618   */ {allowable+  636,118,75, 195, 201},
/*   91:0.52532   */ {allowable+  653,101,89, 190, 196},
/*   92:0.64199   */ {allowable+  616,138,62, 199, 206},
/*   93:0.69473   */ {allowable+  592,162,50, 204, 211},
/*   94:Q.8ú140   */ {allowable+  518,236,27, 215, 223},
/*   95:0.13193   */ {allowable+  736,18,288, 150, 159},
/*   96:0.24859   */ {allowable+  716,38,194, 165, 172},
/*   97:0.29904   */ {allowable+  704,50,162, 170, 176},
/*   98:0.41671   */ {allowable+  679,75,118, 180, 186},
/*   99:0.36249   */ {allowable+  692,62,138, 176, 182},
/*  100:0.47915   */ {allowable+  665,89,101, 186, 192},
/*  101:0.53008   */ {allowable+  653, 101,89, 190, 196},
/*  102:0.64678   */ {allowable+  616, 138,62, 200, 206},
/*  103:0.42473   */ {allowable+  679, 75,118, 181, 187},
/*  104:0.54139   */ {allowable+  646, 108,83, 191, 197},
/*  105:0.59256   */ {allowable+  636, 118,75, 195, 201},
/*  106:0.70923   */ {allowable+  580, 174,45, 206, 212},
/*' 107:0.64954   */ {allowable+  616, 138,62, 200, 206},
/*  108:0.76621   */ {allowable+  560, 194,38, 211, 218},
```

*Fig. 25*

```
/*  109:0.81883  */   {allowable+ 518, 236,   27,  216, 224},
/*  110:0.93550  */   {allowable+ 374, 380,    9,  231, 246},
/*  111:0.52068  */   {allowable+ 653, 101,   89,  189, 195},
/*  112:0.63734  */   {allowable+ 616, 138,   62,  199, 205},
/*  113:0.69021  */   {allowable+ 592, 162,   50,  204, 210},
/*  114:0.80688  */   {allowable+ 539, 215,   32,  215, 222},
/*  115:0.75187  */   {allowable" 560,  194,  38,  209, 217},
/*  116:0.86854  */   {allowable+ 466, 288,   18,  222, 231},
/*  117:0.94624  */   {allowable+ 357, 397,    8,  233, 245},
/*  118:0.98903  */   {allowable+ 148, 606,    2,  245, 250},
/*  119:0.95945  */   {allowable+ 318, 436,    6,  236, 246},
/*  120:0.99182  */   {allowable+  38, 716,    1,  247, 251},
/*  121:0199226  */   {allowable+  38, 716,    1,  247, 251},
/*  122:0.99832  */   {allowable+  38, 716,    1,  250, 253},
/*  123:0.99224  */   {allowable+  38, 716,    1,  247, 251},
/*  124:0.99832  */   {allowable+  38, 716,    1,  250, 253},
/*  125:0.99753  */   {allowable+  38, 716,    1,  250, 252},
/*  126:0.99964  */   {allowable+  38, 716,    1,  251, 254},
/*  127:0.00004  */   {allowable+ 753,   1,  716,  127, 129},
/*  128:0.00034  *7   {allowable+ 753,   1,  716,  127, 130},
/*  129:0.00094  */   {allowable+ 753,   1,  716,  128, 130},
/*  130:0.00184  */   {allowable+ 753,   1,  716,  128, 131},
/*  131:0.00305  */   {allowable+ 753,   1,  716,  129, 132},
/*  132:0.00455  */   {allowable+ 753,   1,  716,  129, 133},
/*  133:0.00635  */   {allowable+ 753,   1,  716,  130, 134},
/*  134:0.00845  */   {allowable+ 753,   1,  716,  130, 135},
/*  135:0.01084  */   {allowable+ 752,   2,  606,  131, 136},
/*  136:0.01353  */   {allowable+ 752,   2,  606,  131, 137},
/*  137:0.01651  */   {allowable+ 751,   3,  538,  132, 138},
/*  138:0.01978  */   {allowable+ 751,   3,  538,  132, 139},
/*  139:0.02335  */   {allowable+ 750,   4,  496,  129, 141},
/*  140:0.02720  */   {allowable+ 750,   4,  496,  132, 142},
/*  141:0.03133  */   {allowable+ 749,   5,  462,  134, 143},
/*  142:0.03575  */   {allowable+ 749,   5,  462,  136, 143},
/*  143:0.04044  */   {allowable+ 749,   6,  436,  137, 144},
/*  144:0.04542  */   {allowable+ 748,   6,  436,  139, 145},
/*  145:0.05066  */   {allowable+  47,   7,  415,  140, 146},
/*  146:0.05618  */   {allowable+ 745,   9,  380,  142, 147},
/*  147:0.06196  */   {allowable+ 745,   9,  380,  143, 148},
/*  148:0.05801  */   {allowable+ 744,  10,  356,  144, 149},
/*  149:0.07432  */   {allowable+ 743,  11,  353,  145, 150},
/*  150:0.08089  */   {allowable+ 741,  10,  330,  147, 151},
/*  151:0.08771  */   {allowable+ 741,  13,  330,  148, 152},
/*  152:0.09477  */   {allowable+ 741,  13,  330,  149, 153},
/*  153:0.10208  */   {allowable+ 738,  16,  303,  150, 154},
/*  154:0.10963  */   {allowable+ 738,  16,  303,  151, 155},
/*  155:0.11742  */   {allowable+ 737,  17,  295,  152, 156},
```

Fig. 26

```
/*  156:0.12543   */   {allowable+ 736, 18, 288, 153, 157},
/*  157:0.13367   */   {allowable+ 732, 22, 262, 155, 158}.
/*  158:0.14213   */   {allowable+ 732, 22, 262, 156, 159},
/*  159:0.15081   */   {allowable+ 731, 23, 256, 157, 160},
/*  160:0.15970   */   {allowable+ 731, 23, 256, 158, 161},
/*  161:0.16879   */   {allowable+ 727, 27, 236, 159, 162},
/*  162:0.17808   */   {allowable+ 727, 27, 236, 160, 163},
/*  163:0.18757   */   {allowable+ 727, 27, 236, 161, 164},
/*  164:0.19724   */   {allowable+ 722, 32, 215, 162, 165},
/*  165:0.20710   */   {allowable+ 721, 33, 211, 163, 166},
/*  166:0.21713   */   {allowable+ 721, 33, 211, 164, 167},
/*  167:0.22734   */   {allowable+ 716, 38, 194, 165, 168},
/*  168:0.23771   */   {allowable+ 716, 38, 194, 166, 159},
/*  169:0.24823   */   {allowable+ 716, 38, 194, 167, 170},
/*  170:0.25891   */   {allowable+ 713, 41, 185, 168, 171},
/*  171:0.26973   */   {allowable+ 709, 45, 174, 169, 172},
/*  172:0.28069   */   {allowable+ 709, 45, 174, 170, 173},
/*  173:0.29179   */   {allowable+ 709, 45, 174, 171, 174},
/*  174:0.30300   */   {allowable+ 704, 50, 162, 172, 175},
/*  175:0.31434   */   {allowable+ 704, 50, 162, 173, 176},
/*  176:0.32579   */   {allowable+ 704, 50, 162, 174, 177},
/*  177:0.33734   */   {allowable+ 692, 62, 138, 176, 178},
/*  178:0.34900   */   {allowable+ 692, 62, 138, 177, 179},
/*  179:0.36074   */   {allowable+ 692, 62, 138, 178, 180|,
/*  180:0.37257   */   {allowable+ 692, 62, 138, 179, 181},
/*  181:0.38447   */   {allowable+ 689, 65, 133, 180, 182},
/*  182:0.39644   */   {allowable+ 689, 65, 133, 181, 183},
/*  183:0.40848   */   {allowable+ 679, 75, 118, 182, 184},
/*  184:0.42057   */   {allowable+ 679, 75, 118, 183, 185},
/*  185:0.43271   */   {allowable+ 679, 75, 118, 184, 186},
/*  186:0.44489   */   {allowable+ 671, 83, 108, 185, 187},
/*  187:0.45710   */   {allowable+ 671, 83, 108, 186, 188},
/*  188:0.46934   */   {allowable+ 665, 89, 101, 187, 189},
/*  189:0.48160   */   {allowable+ 665, 89, 101, 188, 190},
/*  190:0.49386   */   {allowable+ 665, 89, 101, 189, 191},
/*  191:0.50614   */   {allowable+ 653, 101, 89, 190, 192},
/*  192:0.51840   */   {allowablee 653, 101, 89, 191, 193},
/*  193:0.53066   */   {allowable+ 653, 101, 89, 192, 194},
/*  194:0.54290   */   {allowable+ 646, 108, 83, 193, 195},
/*  195:0.55511   */   {allowable+ 646, 108, 83, 194, 196},
/*  196:0.56729   */   {allowable+ 636, 118, 75, 195, 197},
/*  197:0.57943   */   {allowable+ 636, 118, 75, 196, 198},
/*  198:0.59152   */   {allowable+ 636, 118, 75, 197, 199},
/*  199:0.60356   */   {allowable+ 621, 133, 65, 198, 200},
/*  200:0.61553   */   {allowable+ 621, 133, 65, 199, 201},
/*  201:0.62743   */   {allowable+ 616, 138, 62, 200, 202},
/*  202:0.63926   */   {allowable+ 616, 138, 62, 201, 203},
```

*Fig. 27*

```
/*  203:0.65100  */    {allowable+ 616, 138,  62, 202, 204},
/*  204:0.66266  */    {allowable+ 616, 138,  62, 203, 205},
/*  206:0.67421  */    {allowable+ 592, 162,  50, 204, 207},
/*  206:0.68666  */    {allowable+ 592, 162,  50, 205, 208},
/*  207:0.69700  */    {allowable+ 692, 162,  50, 206, 209},
/*  208:0.70821  */    {allowable+ 580, 174,  45, 207, 210},
/*  209:0.71931  */    {allowable+ 580, 174,  45, 208, 211},
/*  210:0.73027  */    {allowable+ 680, 174,  45, 209, 212},
/*  211:0.74109  */    {allowable+ 569, 186,  41, 210, 213},
/*  212:0.75177  */    {allowable+ 560, 194,  38, 211, 214},
/*  213:0.76229  */    {allowable+ 560, 194,  38, 212, 215},
/*  214:0.77266  */    {allowable+ 560, 194,  38, 213, 216},
/*  215:078287   */    {allowable+ 543, 211,  33, 214, 217},
/*  216:0.79290  */    {allowable+ 543, 211,  33, 215, 218},
/*  217:0.80276  */    {allowable+ 539, 215,  32, 216, 219},
/*  218:0.81243  */    {allowable+ 518, 236,  27, 217, 220},
/*  219:0.82192  */    {allowable+ 818, 236,  27, 218, 221},
/*  220:0.83121  */    {allowable+ 518, 236,  27, 219, 222},
/*  221:0.84030  */    {allowable+ 498, 256,  23, 220, 223},
/*  222:0.84919  */    {allowable+ 498, 256,  23, 221, 224},
/*  223:0.85787  */    {allowablet+ 492, 262,  22, 222, 225},
/*  224:0.86633  */    {allowable+ 492, 262,  22, 223, 226},
/*  225:0.87457  */    {allowable+ 466, 288,  18, 224, 228},
/*  226:0.88258  */    {allowable+ 459, 295,  17, 225, 229},
/*  227:0.89037  */    {allowable+ 451, 303,  16; 226, 230},
/*  228:0.89792  */    {allowable+ 451, 303,  16, 227, 231},
/*  229:0.90523  */    {allowable+ 424, 330,  13, 228, 232},
/*  230:0.91229  */    {allowable+ 424, 330,  13, 229, 233},
/*  231:0.91911  */    {allowable+ 424, 330,  13, 230, 234},
/*  232:0.92568  */    {allowable+ 401, 353,  11, 231, 236},
/*  233:0.93199  */    {allowable+ 388, 356,  10, 232, 237},
/*  234:0.93804  */    {allowable+ 374, 380,   9, 233, 238},
/*  235:0.94382  */    {allowable+ 374, 380,   9, 234, 239},
/*  236:0.94934  */    {allowable+ 339, 415,   7, 236, 241},
/*  237:095468   */    {allowable+ 318, 436,   6, 236, 242},
/*  238:0.95956  */    {allowable+ 318, 436,   6, 237, 244},
/*  239:0.96426  */    {allowable+ 292, 462,   5, 238, 245},
/*  240:0.96867  */    {allowable+ 292, 462,   5, 238, 247},
/*  241:0.97280  */    {allowable+ 258, 496,   4, 239, 249},
/*  242:0.97668  */    {allowable+ 258, 496,   4, 240, 252},
/*  243:0.98022  */    {allowable+ 216, 538,   3, 242, 249},
/*  244:0.98349  */    {allowable+ 216, 538,   3, 243, 249},
/*  245:0.98647  */    {allowable+ 148, 606,   2, 244, 250},
/*  246:0.98916  */    {allowable+ 148, 606,   2, 245, 250},
/*  247:0.99165  */    {allowable+  38, 716,   1, 246, 251},
/*  248:0.99365  */    {allowable+  38, 716,   1, 247, 251},
/*  249:0.99546  */    {allowable+  38, 716,   1, 248, 252},
```

Fig. 28

```
/* 250:0.99695 */ {allowable+ 38, 716,  1, 249, 252},
/* 251:0.99816 */ {allowable. 38, 716,  1, 250, 253},
/* 262:0.99906 */ {allowable+ 38, 716,  1, 251, 253},
/" 263:0.99966 */ {allowable+ 38, 716,  1, 251, 254},
/* 254:0.99996 */ {allowable+ 38, 716,  1, 252, 254},
#endif
/* 255:inactive */ {allowable+ 38, 1509, 1509, 255, 255} static struct
{
ushort InternalBuffer;
int jotCount;
FILE "externalIn;
} d;

/* Initialize decoding. */
void elsDecodeStart (FILE *file)
{
d.externalIn = file;
d.jotCount = JOTS_PER_BYTE;
/* Import first two bytes from external file. */
d.internalBuffer = fgetc (file);
d.internalBuffer = (d.internalBuffer<<8)  fgetc(file);
}

/* Decode a sIngle bit. */
int elsDecodeBit (ElsRung *rung)
{
/* Determine whether 0 or 1. */
if (d.internalBuffer >= ladder [*rung] .threshold [d. jot Count])
{
/* 1: */
d. internalBuffer -= ladder[*rung] .threshold [d.jotCount];
d.jotCount -= ladder[*rung].codeLength1:
#ifdef ALACRITOUS
/* Update probability. */
*rung = ladder [*rung] .next1;
#endif
if (d.jotCount <= 0)
{
/* Import a byte. */
if ((d.jotCount += JOTS_PER_BYTE)<=0)
{
fprintf(stderr, "elsDecodeBit: called wIth inactive rung.\n");
exit (1);
}
d.internalBuffer <<=;
```

Fig. 29

```
d.internalBuffer = fgetc(d. externalIn);
#ifndef ALACRITOUS
/* Update probability. */
*rung = ladder [*rung] .next1;
#endif
}
return 1;
}
else
{
/* 0: Suffer value need not change. */
d.jotCount -= ladder[*rung] .codeLength0;
#ifdef ALACRITOUS
/* Update probability */
*rung = ladder [*rung]. next0;
#endif
if (d.jotCount <=0)
{
/* Import a byte. */
if ((d.jotCount += JOTS_PER_BYTE)<=0)
{
fprintf(stderr,"elsDecodeBit: called with inactive rung.\n")
exit (1);
}
d. internalBuffer <<=8;
d. internalBuffer = fgetc (d.externalIn)
#Ifndef ALACRITOUS
/* Update probability */
*rung = ladder[*rung] next0;
#endif
}
return 0;
}
}

/* Perform consistency check prior to ending decoding. */
int e;sDecpde0k()
{
long x;

if (d. jotCount==JOTS_PER_BYTE);
        x = 658361;
else
        x = allowable[d.jotCount+J0TS_PER_BYTE];
x = (x*(d.JotCount-1))/JOTS_PER_BYTE;
return d.internalBuffer == x;
```

*Fig. 30*

```
/* Conclude decoding. */
void elsDecodeEnd()
{
/* No action necessary. */
} static struct
{
ulong min;
int jotCount;
int backlog;
FILE *externalOut;
} e;

/* Initialize encoding. */
void elsEncodeStart(FILE *file)
{
e. backlog = 0;
e. min = 0;
e. jotCount = JOTS_PER_BYTE;
e. externalOut = file;
}

/* Encode a single bit. */
void elsEncodeBit (ElsRung *rung. int bit)
{
if (bit)
{
/* Encode a 1 */
e.min += ladder[*rung] .threshold[e.jotCount];
e.jotCount -= ladder[*rung] .codeLength1;
#ifdef ALACRITOUS
*rung = ladder[*rung]. next1;
#endif
}
else
{
/* Encode a 0. */
e.jotCount -= ladder[*rung] .oodeLength0;
#ifdef ALACRITOUS
*rung = ladder[*rung] .next0;
#endif
}
if (e.jotCount <=0) /* Will the decoder irport a byte? */
{
ulong difffBits;
```

*Fig. 31*

```
/* First check for bytes ready to export. *7
If ((e.jotCount += JOTS_PER_BYTE) <=0)
{
fprintf (stderr, "elsEncodeBit: called with inactive rung.\n")
exit (l);
}
diffBits = (e.min + allowable[e.jotCount] - 1)   e.min;
switch(e. backlog)
{
default: /* 2 or greater */
if (diffBits&OxFF000000)
break;
fputc((e.min >>24,e.externalOut);
while (--e.backlog > 1)
fputc((e.min>>16)&0xFF,e.externalOut);
case 1:
if (diffBits&0x00FF0000)
break;
fputc((e.min>>16)&0xFF, e.externalOut);
e.backlog--;
case 0:
if (diffBits&0x0000FF00)
break;
fputc((e.min>>8)&0xFF,e.externalOut)
e. backlog--;
}
e . backlog++;
/* Now move one byte from preactive to active. */
if (e.backlog>2)
        e..min = (e.min&0xFF000000)   ((e.min&0x0000FFFF)<< 8);
else
        e.min <<= 8;
#ifndef ALACRITOUS
if (bit)
*rung = ladder[*rung] .next1;
else
        "rung = ladder [*rung] next0;
endif }
}
/* Conclude encoding. */
void elsEncodeEnd
{
long x;
```

*Fig. 32*

```
/*
0 Consistency check.
*/
if (e.jotCount==JOT_PER_BYTE)
x =     655361;
else
        x = allowable[e.jotCount+JOTS_PER_BYTE];
x = (x*(e.jotCount-1))/JOTS_PER_BYTE;
e.min += x;

switch (e. backlog)
        {
default:
        fputc((e..min>>24)&0xFF,e.externalOout)
while(--e.backlog > 1)
        fputc((e.min>>16)&0xFF,e.externalOut);
case 1:
        fputc((e.rnin>>16)&0xFF,e.externalOut)
case 0:
fputc((e.min>>8)&0xFF,e.externalOut)
}
fputc((e.min)&0xFF,e.externalOut);
}
```

*Fig. 33*

```
/*
 0 "compress.c": Test program for entropy coding: compresses a file
 0 using a one-byte data nodel.
*/
#include <stdio.h>
#include "elscoder.h"

ElsRung context [256];

int main (int argc, char *argv[])
{
FILE *inFile,*outFile;
int buffer, cIndex;

if (argc!=3)
{
fprintf (stderr,"Usage: \n\n compress <inFile> <outFile>\n\n"
"Tests entropy coder with 1-byte-context file encoding.\n");
return 1;
} if (!(inFile = fopen(argv[1],"rb")))
{
printf("Unable to open input file.\n");
return 1;
}
if (! (outFile = fopen(argv[2] , "wb")))
{
printf("Unable to open input file.\n");
return 1;
}

/*
 0 Initialize probabilities of state maohine.
*/
for (cIndex=0; cIndex<256; cIndex++)
context[cIndex] = 0;

elsEncodeStart:(outFile)
while((buffer = fgetc(inFile)) != EOE)

{
cIndex = 1;
elsEncodeBit(context+cIndex, buffer&0x80);
cIndex = (cIndex<<1)   !! (buffer&0x80);
elsEncodeBit (context+cIndex,buffer&0x40)
```

*Fig. 34*

```
cIndex = (cIndex<<1)  !! (buffer&0x40)
elsEncodeBit (context+cIndex, buffer&0x20);
cIndex = (cIndex<<1)  !! (buffer&0x20);
elsEncodeBit(context+cIndex, buffer&0x10);
cIndex = (cIndex<<1)  !! (buffer&Ox10)
elsEncodeBit(context+cIndex, buffer&0x08);
cIndex = (cIndex<<1)  !! (buffer&0x08)
elsEncodeBit(context+cIndex, buffer&0x04);
cIndex = (cIndex<<l)  !! (buffer&0x04);
elsEncodeBit (context+cIndex, buffer&0x02);
cIndex = (cIndex<<1)  !! (buffer&0x02)
elsEncodeBit(context+cIndex, buffer&0x01);
cIndex = (cIndex<<1)  !! (buffer&0xOl)
if (buffer==255)
{
/* Send 0 to distinguish from EOF marker. */
elsEncodeBit (context, 0);
}
}
/* Send 255 followed by 1 for EOF marker. */
elsEncodeBit (context+1,1);
elsEncodeBit (context+3, 1);
elsEncodeSit (context+7, 1);
elsEncodeBit (context+15, 1);
elsEncodeBit (context+31, 1);
elsEncodeSit (context+63, 1);
elsEncodeBit(context+127,1);
elsEncodeBit (context+255,1);
elsEncodeBit (context, 1);

elsEncodeEnd();
fclose(outFile)
fclose(inFile);

return 0;
}
```

*Fig. 35*

```
/*
~       "expand. c":  Test program for entropy coding:  decodes a file
~       using a one-byte model.
*/
#include <stdio.h>
#include "elscoder.h"

ElsRung context [256];

int main (int argc, char *argv[])
{

FILE *inFile *outFile;
int buffer;

if (argc!=3)
{
        fprlntf (stderr,"Usage: \n\nexpand <inFile> <outFile>\n\n"
        "Tests entropy encoder with 1-byte-context file decoding.\n");
        return 1;
} if (! (inFile = fopen(argv[l] ,"rb")))   -
{
fprintf(stderr,"Unable to open input file.\n");
        return 1;
}
if (! (outFile = fopen(argv[2] ,"wb") ))
{
fprintf(stderr,"Unable to open output file.)n");
        return 1;
}

/*
0 Initialize probabilities of state machine.
*/
for (buffer=0; buffer<256; buffer++)
        context [buffer] = 0;

elsDecodeStart(inFile)

while(1)
{
        buffer=1;
        buffer = (buffer<<1)  elsDecodeBit(context+buffer);
```

*Fig. 36*

```
buffer = (buffer<<1)  elsDecodeBit(context+buffer);
buffer = (buffer<<1)  elsDecodeBit(context+buffer);
buffer = (buffer<<1)  elsDecodeBit(context+buffer);
buffer = (buffer<<1)  elsDecodeBit(context+buffer);
buffer = (buffer<<1)  elsDecodeBit(context+buffer);
buffer = (buffer<<l)  elsDecodeBit(context+buffer);
buffer = (buffer<<1)  elsDecodeBit(context+buffer);
buffer &= 0xFF;
if ((buffer==255)&& elsDecodeBit(context))
{
if (elsDecodeOk())
        printf("ELS Decoder consistency check succeeded.\n");
else
{
fprintf(stderr,"ELS Decoder consistency check failed.\n");
return 1;
}
elsDecodeEnd()
fclose(outFile)
fclose(inFile)
return 0;
}
fputc(buffer, outFile)
}
}
```

RAPID ENTROPY CODING FOR DATA COMPRESSION OR DECOMPRESSION

FIELD OF THE INVENTION

This invention relates to compressing digital data.

BACKGROUND OF THE INVENTION

The problem of compressing digital data of a certain type (text, images, audio data, whatever) can be decoupled into two subproblems: Modeling and entropy coding. Whatever the given data may represent in the real world, in digital form it can be represented as a sequence of symbols, such as bits. The modeling problem is to choose a suitable symbolic representation for the data and to predict for each symbol of the representation the probability that it takes each of the allowable values for that symbol. The entropy coding problem is to code each symbol as compactly as possible, given this knowledge of probabilities. When the compression is, there is a third subproblem, that is only touched on herein: Evaluating the relative importance of various kinds of errors.

For example, suppose we want to transmit messages composed of the four letters a, b, c, and d. A straightforward scheme for coding these messages in bits would be to represent a by "00", b by "01", c by "10" and d by "11." For example, the sequence "aadabacb" would be represented by (0000110001001001). However, suppose we know that for any letter of the message (independent of all other letters), a occurs with probability 0.5, b occurs with probability 0.25, and c or d occur with probability 0.125 each. Then we might choose a shorter representation for a, at the necessary cost of accepting longer representations for the other letters. We could represent a by "0", b by "10", c by "110", and d by "111". This representation (00111010011010) is more compact on average than the first one for the sequence "aadabacb"; indeed, it is the most compact representation possible (though not uniquely so, because a could be "1," b "01," etc.). In this simple example, the modeling part of the problem is determining the probabilities for each symbol; and the entropy-coding part of the problem is determining the representations in bits from those probabilities. This example illustrates that the probabilities associated with the symbols play a fundamental role in entropy coding.

In general, entropy coding is an abstract problem weakly related to the type of data being compressed, while the modeling aspect of data compression depends intimately on the type of data being compressed. Entropy coding is well understood theoretically. Known and existing algorithms provide the greatest compression possible for a given modeling method, while for many real-world types of data, the modeling issue is as yet mysterious and only somewhat tractable. This invention focuses on entropy coding and modeling; thus it provides at least a partial solution to almost all data compression problems.

One well-known method of entropy coding is Huffman coding, which yields an optimal coding provided all symbol probabilities are integer powers of 0.5. Another method, yielding optimal compression performance for any choice of probabilities, is arithmetic coding. In spite of the superior compression given by arithmetic coding, so far it has not been a dominant presence in real data compression applications, due to concerns over speed and complexity. What is thus needed is a rapid, simple algorithm for arithmetic coding.

An algorithm is known which allows rapid encoding and decoding in a fashion akin to arithmetic coding, known as the Q-coder algorithm, which is the subject of patents including U.S. Pat. No. 4,286,256; 4,463,342; 4,467,317, and others (all to Langdon et al.). The QM-coder is a subsequent variant of that algorithm. These algorithms fail to adapt rapidly or closely to changing symbol probabilities, require pre-selection of least and most probable symbols, and use the bit as their basic import and export unit, slowing compression; thus, new algorithms with competitive performance continue to be of interest. The algorithm described here provides the needed improved performance and provides a general solution to all very high efficiency entropy coding problems; we alternatively call the present invention the ELS-coder (for Entropy Logarithmic-Scale).

A general introduction to data compression theory is not provided, nor a description of other algorithms for entropy coding.

We now point out similarities and differences between the present invention and the known Q-coder, further described in the above-referenced series of patents.

The Q-coder is easily interpreted in terms of our paradigm for a decoder as given below (actually we would claim that any decoder can be described by this paradigm, but the description is more transparent for some than for others). Like the present invention, the Q-coder uses two components to describe the state of the decoder at any time: one, the "augend," denoted A, describes the amount of data at any time (as does jotCount, below); the other, denoted X, gives the content of that data (as does internalBuffer, below). While jotCount, as described in detail below, directly measures the quantity of data—the corresponding number of allowable states being given by an exponential relation as embodied in the table allowable [], the augend A in the Q-coder directly measures the number of allowable states in the decoder—the corresponding quantity of data being proportional to the logarithm of A. Most points of difference between the two coders are consequences of this fundamental difference.

Ideally, while decoding a symbol, the proportion of allowable states corresponding to the symbol 0 should match the probability $p_0$ that the symbol is 0. Determining the number of allowable states corresponding to each symbol therefore requires a multiplication or division to be accomplished in some way. In the present invention, the number of allowable states allocated to the symbol 0 is given by an entry of a lookup table threshold [] depending on $p_0$. Since the present invention represents the number of states indirectly, via an exponential table, a simple addition performed on the index into the table is equivalent to a multiplication performed on the number of allowable states. It is interesting to note that in spite of the fundamental role played by probabilities in entropy coding, the preferred embodiment herein described operates without representing any probabilities directly. By contrast the Q-coder represents each probability state by a single number (called a Qe-value) proportional to the probability. The Q-coder approximates the desired multiplication operation either by subtracting the Qe-value directly from the augend A or by assigning the Qe-value to A.

This approximation provides (perhaps surprising) coding efficiency, but it does impose some constraints on the design of the Q-coder:

(1) Maintaining sufficient accuracy of approximation requires that the number of allowable states in the decoder be restricted to a much smaller range than that used herein; in general the number of allowable states is not permitted to vary by more than a factor of two (whereas in the preferred embodiment as described here, this number varies by a factor of 255). As a consequence, data must be imported much more frequently in the Q-coder than in the present invention. Moreover, this data import operation is also more complex in the Q-coder: One or several bits may be imported at one time, whereas in the preferred embodiment of the present invention, the quantity of data imported is always exactly one byte.

(2) The approximation is most accurate for small values of the probability, and is acceptable only for values less than one-half. Thus the Q-coder does not work with symbols 0 and 1 but with the so-called "MPS" (more probable symbol) and "LPS" (less probable symbol). In encoding or decoding a binary symbol, the Q-coder must determine which of 0 or 1 is the MPS. Such an extra level of indirection may, in certain circumstances, be useful in implementing the principles of the present invention, and should be considered as an alternative embodiment of the present invention, but has not been necessary.

Unlike the present invention, the Q-coder has no data leaks (see below). On the other hand, under the best of conditions, the approximation used in the Q-coder is less accurate than that used herein, even with data leaks taken into consideration.

The Q-coder uses a probability ladder as does the present invention, but derived on different principles. This ladder relies strictly on inalacritous probability updating, i.e., driven by the compressed data stream as described below; an alacritous version, driven by an uncompressed data stream, would certainly be possible, even more so based on the disclosure of the present invention, but does not seem to have been the subject of much study.

The question of which of the Q-coder or the present invention codes more efficiently and which operates more rapidly depends on many issues of architecture and nature of the data. The Q-coder performs best in the realm of profound compression: that is, when the probability of the LPS is very close to 0 and each symbol can be coded very compactly. The approximation used in the Q-coder provides its best coding efficiency in such a case, and a high compression ratio entails less frequent importing of data, so that operation is faster. Indeed the highest compression level attainable by the Q-coder ($2^{15}$:1) exceeds that of the preferred embodiment herein described (754:1 if JOTS_PER_BYTE takes the value 754). In relative terms the difference is large (a ratio of 43.5) but in absolute terms it is small (a difference of 0.00130 bits per symbol). Even in profound compression it can be argued that the absolute measure of coding efficiency is more important. An alternative embodiment of the present invention using sixteen-bit words rather than eight-bit bytes as its basic unit of data would provide profound compression comparable to that of the Q-coder with about twice the memory usage of the described preferred embodiment.

In the realm of mild compression, the superior accuracy and less frequent data import of the present invention probably give it an edge. Data compression applications can often be designed so that profound compression is unnecessary; such a design is likely to improve both speed and compression efficiency. For example, in a simple binary model, if 0 is overwhelmingly more probable than 1, one is likely to find long runs of the symbol 0 in the data. Run-length-encoding the symbols 0 would reduce the number of calls to the entropy coder while reducing the dependence of compression ratio on achievability of profound compression.

Another example of such a design decision is given in the sample programs compress.c and expand.c with respect to the coding of the end-of-file marker. The bit indicating end-of-file could have been inserted at the base of the state tree. However, this would require every byte of the compressed file to carry an extra 0 bit indicating that it was not end-of-file; profound compression would be needed to compress these bits collectively to a tiny portion of the file. By attaching this bit rather to a node of the tree, we insured that such bits would usually appear much less often; thus these bits usually represent a small portion of the compressed file even without profound compression.

SUMMARY OF THE INVENTION

A method of manipulating a series of data units comprising distinct data values, including the steps of modelling the occurrence probability of each distinct data value, repeatedly performing the steps of narrowing a manipulation result number into a subinterval determined by the occurrence probability for each successive data value and outputting the more significant digits of the manipulation result number, that can no longer change due to further narrowing, such that the sequence of the output digits are the manipulated data.

BRIEF DESCRIPTION OF THE DRAWINGS

Preferred embodiments of the apparatus and method of this invention will be described in detail below in connection with the following drawings, in which like numbers refer to like components:

FIG. 2 through FIG. 6 are program listings embodying concepts of the present invention, given in the C programming language;

FIG. 13 through FIG. 36 are sample program listings of a preferred embodiment of the present invention.

DETAILED DESCRIPTION OF THE PREFERRED EMBODIMENT

Figure 1:
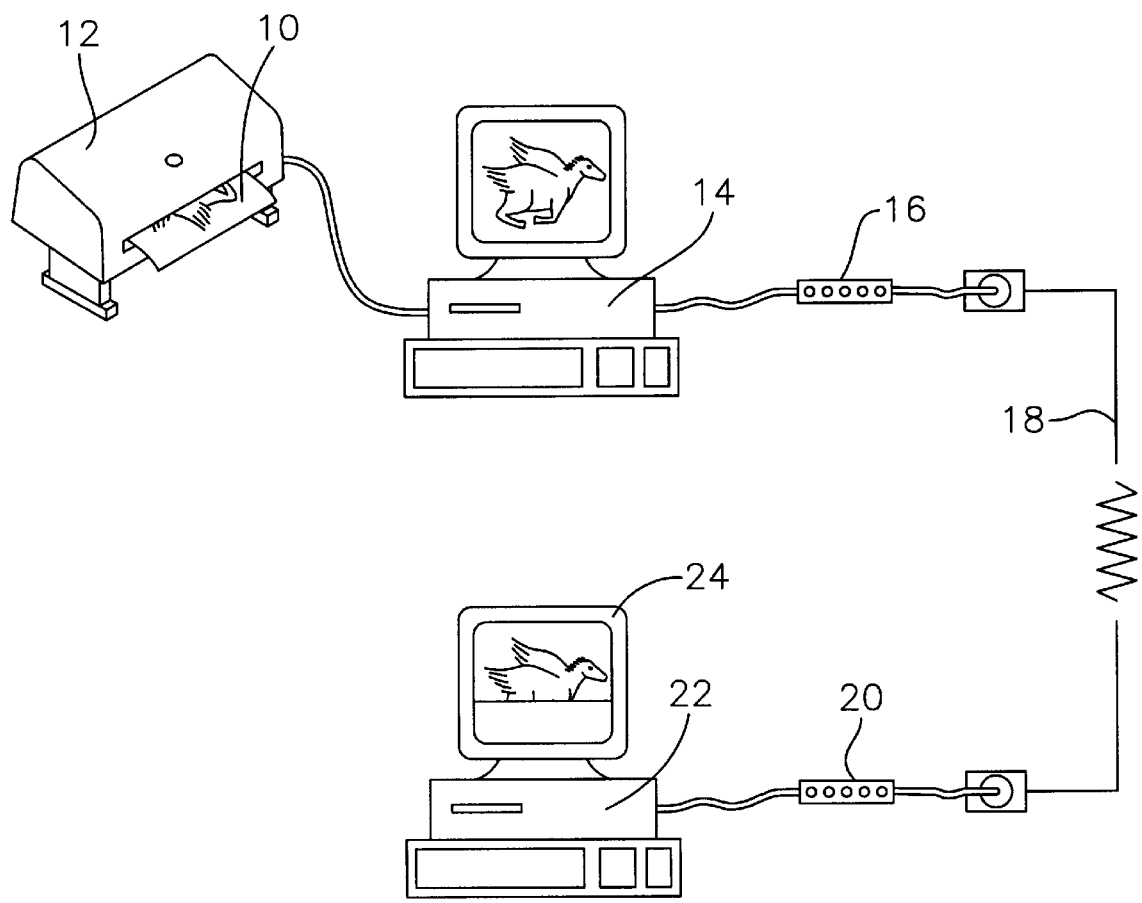
FIG. 1 is a schematic of the present invention in an example of use.

FIG. 1 illustrates an application in which the present invention finds use. An image 10 is scanned using a scanner 12, such as the Hewlett Packard 4C or the IBM Options scanner, into computer 14. Computer 14, which is preferably a computer having a processor of at least the power of the Intel 386 microprocessor chip, as well as a hard drive, a keyboard, and a monitor, runs a program that embodies the principles of the present invention, such as the preferred program listed in FIGS. 13–36, compiled for the use of the processor. The image having been modeled using known algorithms that are not the subject of the present invention, such as Pegasus Imaging Corporation's Rapidvue™ progressive JPEG program, it is encoded using the present invention into a compressed data stream for transmission via a modem 16 across telephone lines 18.

When the compressed image is received via a second modem 20, a second, receiving computer 22, which may be similar to the first computer described above, runs the decoding portion of the present invention. The resulting data can then be reconstructed using known algorithms, such as Pegasus Imaging Corporation's Rapidvue™ progressive JPEG software, into the original data as operated on in computer 14, which can then be used, for example by displaying on the screen 24 of computer 22. Although the present invention is perfectly suited to a hardware embodiment such as a chip designed to carry out the functions to be described, a preferred embodiment of the present invention comprises a program operating on a computer such as the one described above. Alternate computers of equal or greater processing power are suitable, including VAX and SUN computers and others.

The present invention preferably works with an alphabet of two symbols (which we call 0 and 1): It can certainly encode symbols from larger alphabets, and which may alternatively be converted to a two-symbol format first. Example programs are provided which illustrate how this may conveniently be done. While such conversion may affect efficiency and accuracy, the preferred restriction to a two-symbol alphabet facilitates rapid coding and rapid probability estimation.

The preferred embodiment is particularly apt for applications which involve compressing a dataset once and subsequently decompressing it many times (both compression and decompression are types of data manipulation, that is, methods of manipulating a series of data units). Because decoding speed is of somewhat greater concern to us than encoding speed, the decoder has been optimized first, and the encoder designed to match.

Let us consider first the procedures in FIG. 2, that form a crude decoder. This decoder does not as yet provide any compression; it simply extracts bits from a file (and not in the most efficient manner, either). The most-significant bits of each byte in the file are extracted first. We give it here purely as an illustration of our paradigm for the operation of a decoder (throughout this specification, we assume that a "char" or byte has eight bits of precision, a "short" has sixteen bits of precision, and a "long" has thirty-two bits of precision).

For the decoder to hold data, it must be in one of several states, the state itself holding temporary information. It is convenient to represent the state of the decoder by two components: one indicating the quantity of data held by the decoder (bitCount) and another indicating the content of that data (internalBuffer). When called upon to decode a symbol (the procedure decodeBit( )), the decoder is in one of several possible states. One subset of these states represents the symbol 0, and another represents the symbol 1. The decoder must determine to which subset its state belongs (by comparing internalBuffer to threshold[bitCount]). It then transits to a new state to reflect the depletion of its store of data (by decrementing bitCount and, if necessary, decreasing internalBuffer). At times (when bitCount reaches the value 0) the decoder must replenish its store of data by reading from an external file (the procedure decode Import( )). This import operation modifies both internalBuffer and bitCount.

Based on this simple example, we will describe the decoding algorithm of the present invention. FIG. 2 introduces the table allowable, but does not yet use it. It is the counterpart of a mathematical function we call S, relating the quantity of data in the encoder to the number of allowable states. A number with B bits of precision can take $2^B$ distinct values; thus $S(B)=2^B$. In FIG. 2, allowable [bitCount] takes the value S(B) when bitCount takes the value B. Thus there are allowable [bitCount] allowable values for internalBuffer at any time. The insight underpinning arithmetic coding is that this relationship between the number of bits in the decoder and the number of allowable states remains valid even when B is not an integer and S(B) is not a power of two.

Also, we apportioned the allowable values corresponding to 0 and 1, respectively, so that all of the former values were less than all of the latter. Thus we can determine to which subset of values the value of internalBuffer belongs by comparing it to threshold [bitCount], which is the minimum value of internalBuffer corresponding to 1. When the symbol 0 is decoded, the number of allowable values for internalBuffer necessarily becomes the value of threshold [bitCount] before decoding the symbol.

FIG. 3 describes a preferred embodiment of the present invention, although at a crude level of accuracy (procedures for initializing and terminating the decoding process are not shown and shall be described below). FIG. 3 introduces the following changes over FIG. 2:

First: To compress symbols from a binary alphabet, one must work with quantities of data smaller than a bit, or no compression is possible. Therefore a "jot" is defined to be a unit of data equal to 1/F of a byte, F being an integer larger than 8. This is equivalent to subdividing a byte into at least nine units, each of which, as will be explained below, corresponds to one occurrence of a theoretically most probable value. In FIG. 3, F is given the value 15, and is represented by the macro JOTS_PER_BYTE. Preferably, F takes much larger values, thus often permitting greater compression under certain circumstances. The decoder of FIG. 3 measures data in jots rather than bits.

For example, allowable [jotCount] now gives the number of allowable values for internalBuffer for a given number of jots. This is determined by the same relation as previously: When jotCount takes the value J, allowable[jotcount] takes the value S(8J/F) with appropriate rounding ("appropriate" shall be discussed fully later), S still measuring data in bits. For example, 23 jots is equal to 23/15 bytes or 8 *23/15 bits. The number of corresponding allowable values is S(8 *23/15)=4927.59. We round this value to give a value of 4928 for allowable [23].

Second: the present invention considers the probability associated with the given symbol. Thus decodeBit( ) now has a parameter rung (whose relation to the probability will later be made explicit). This is used as an index into a table ladder( ) of structures with three elements: CodeLength0 and codeLength1, indicating the number of jots required to code 0 and 1, respectively; and threshold, which (as before) is the lower bound for allowable values of internalBuffer corresponding to the symbol 1 (the aptness of our terminology ladder and rung will become apparent below, when we discuss probability estimation).

Third: Unlike bitCount in FIG. 2, jotCount is not decremented by a single predictable amount for each symbol decoded. JotCount may not hit the value 0, exactly, when it is decremented. Therefore internalBuffer has been expanded from one byte to two; the higher-order byte may be thought of as the working byte and the lower-order byte the reserve byte. The reserve byte is preferably completely filled with data and the working byte at least partially filled with data;

this is equivalent to maintaining at least one spare byte of data, up to 256 allowable values, for internalBuffer. We let JotCount indicate the amount of data in the working byte of internalBuffer, negative values of JotCount indicating that the reserve byte is at least partially depleted. Meaningful values for JotCount range from minus JOTS_PER_BYTE when the decoder is completely empty of data (though in actual operation the minimum value attained by jotCount is 1JOTS_PER_BYTE), to JOTS_PER_BYTE when the decoder is completely full. The decoder calls decodeImport when the value of jotCount dips to zero or lower. Moreover, jotCount is never decremented by more than JOTS_PER_BYTE in a single call to decodeBit, lest we exhaust the reserve byte.

Fourth: The operation of importing a byte is complicated somewhat by the expansion of internalBuffer to two bytes, because data may be present before the import. Importing a byte now involves a shift and OR operation rather than a simple assignment as in FIG. 2

Consider as an example a call to decodeBit( ) with a value of 1 for rung, the value of jotCount being 3. This indicates that internalBuffer contains F+3=18 meaningful jots. Note that the value of allowable [18] is 776; thus the value of internalBuffer must be one of 0, 1, . . . , 775. If the decoded symbol is 0, then jotCount will be decreased to 2 by subtracting ladder[1]. codeLength0, and internalBuffer will then contain F +2=17 meaningful jots. If the decoded symbol is 1, then jotcount will be decreased to -1 by subtracting ladder [1]. codeLength1, and internalBuffer will then contain F-1=14 meaningful jots. Note that allowable [17] is 536 and allowable[14] is 177; therefore, out of the 776 allowable values for internalBuffer, the 536 values 0, 1, . . . , 535 represent 0 and the 177 values 536,537, . . . ,712 represent 1, 776-713 equals 63 are due to leakage (see below). Suppose the value of internalBuffer is 600: The first step in decoding the symbol is to compare 600 to 536 (the value of ladder(1).threshold[3]) and see that the symbol is 1. We then add -4 to jotCount, giving it the value -1. The allowable values for internalBuffer are now 0, 1, ... 177; we subtract 536 from internalBuffer (making it 64) to bring it within this range.

Since $-1 \leq 0$, we have exhausted the data in the working byte of internalBuffer; we call decodeImport ( ) to import a byte from the external file. Suppose the next byte in the external file has the value 137. We update the value of internalBuffer to (64 *256)+137=16521 (actually accomplished by shifting and oring) and update the value of jotCount to -1+15=14. Note that the number of allowable values for internalBuffer is now allowable [14+15], or 45283.

A decoder according to the present invention need not use all possible data values.

For example, of the 776 allowable values for internalBuffer, 536 represent 0 and 177 represent 1. The other 776-536-177=63 values are wasted. Although ideally every allowable value should represent either 0 or 1, the preferred restriction, for the sake of speed, of jotCount and allowable to integer values makes such waste unavoidable at least some of the time.

This definition of "allowable" states does not consider the future development of a state. Thus some allowable states may not lead to allowable states in the future; such states are unusable in practice. We shall call the situation where such states exist a data leak. In other words, in the presence of a data leak, there are possible states for the decoder which are not allowable. Another characteristic of a data leak is that some possible coded data streams are illegal or redundant.

Data leaks form one of two main sources of coding inefficiency in the present invention, the other being inaccuracy in the proportion of values corresponding to 0 and 1, which is discussed in below. However, for larger values of JOTS_PER_BYTE, the inefficiency is quite modest. As discussed below, a good working value for JOTS_PER_BYTE is 754; in this case the data leak described causes a coding inefficiency of less than 0.008 bits per symbol.

A data leak exists when some allowable states of the decoder do not lead to allowable states of the decoder at a later time. Since these allowable states embody the data present in the decoder, a data leak implies that data is somehow dissipating into nothing. The situation is analogous to an engine failing to convert all the energy input (as fuel) into usable output energy. In designing an engine, we of course strive to maximize the proportion of input energy converted to output energy. On the other hand, if we designed an engine and found that the output energy was expected to exceed the input energy, we would know that we had made some sort of fundamental error. The analogous principle for the present invention (or for any decoder viewed as described herein) is that all allowable states of the decoder must be derivable from allowable states of the decoder at any earlier time. Our name for a violation of this principle is perpetual motion. Perpetual motion implies the existence of allowable states which are not possible, because they could not result during correct operation of the decoder. Data leaks and perpetual motion are dual evils; while the former is regrettable, the latter must be avoided at all costs, as it represents (ongoing) corruption of the decoder output.

The detection of perpetual motion allows the decoder to monitor the decoded data stream and help ensure correct operation. Code stream values, inadmissible because of data leaks, can be used as escape sequences for other embedded information. This detection and use of otherwise not allowable values for control information to be transmitted between encoder and decoder may conveniently be implemented in the code of the encoder and the decoder. It may permit, for example, switching between alacritous and inalacritous modes (see below) on the recommendation of the encoder. It might also be used, when decoding images and the like, to instruct an application including a decoder according to the present invention when a new image is being sent, when a color palette is changed, or the like.

For example, the components codeLength0 and codeLength1 for each entry of the array ladder [] in FIG. 3 must satisfy the constraint that allowable [jotCount-codeLength0] +allowable [jotCount-codeLength1] <allowable [jotcount] for all values of jotCount between 1 and F, inclusive; i.e., of A allowable values for internalBuffer at any time, those representing 0 and those representing 1 can total to no more than A.

Our example decoding process in FIG. 3 illustrates a second data leak in the decoder, which may be less immediately apparent. This occurs while importing a byte from the external file. Immediately before importing the byte, internalBuffer has 177 allowable values. Importing a byte makes the number of values available 256*177=45312. However, the number of allowable values after importing is specified as 45283; thus 29 allowable values have been lost. This may be inevitable because, constructing the table allowable [], we must take care to avoid perpetual motion while importing a byte. Recall that when jotCount takes the value J, allowable [jotCount] takes the value S(8J/F) with "appropriate" rounding: "appropriate" means that allowable [jotcount] takes the value S(8J/F) rounded to the nearest integer when F<J<2F, but for 0<J<F, to avoid perpetual motion, we calculate allowable [jotCount] as allowable [jotCount+JOTS_PER_BYTE]/256, rounded up.

The choice of the value of rung to be used in a call to decodeBit ( ) is dictated by the probabilities that the symbol to be decoded will be 0 or 1. Suppose that ladder [rung] has values $L_0$ and $L_1$ for codeLength0 and codeLength1, respectively. Let p denote the probability that the symbol is 1. Then the expected number of jots used to code the symbol is $L_0(1-p)+L_1p$. For example, with a value of 0 for rung, the expected number of jots is $(1-p)+4p=1+3p$; with a value of 1 for rung, the expected number of jots is $2(1-p)+2p=2$. For purposes of data compression we would of course prefer the smaller of these two values; we can solve the inequality $1+3p \leq 2$ for p to find that the value 0 is to be preferred to 1 for rung if $p \leq \frac{1}{3}$. With similar calculations we find that 1 is the preferred value if $\frac{1}{3} \leq p \leq \frac{2}{3}$; and 2 is the preferred value if $\frac{2}{3} \leq p$ (at the boundary points between these intervals we may equally well choose the preferred rung value for either side).

Incidentally, the theoretical optimum compression can be calculated by setting $$L_0 = F \cdot \log_{256}(1-p), L_1 = F \cdot \log_{256} p,$$

the corresponding expected number of jots $-F((1-p)\log_{256}(1-p) + p \cdot \log_{256} p)$ is known in data compression theory as the entropy of the symbol (usually measured in bits rather than jots).

All entries of the table ladder [] are calculated so that the values of codeLength0 and codeLength1 satisfy the following constraints, termed the ladder constraints:

(1) allowable [J-codeLength0]+allowable [J-codeLength1]$\leq$allowable [J] for any value of J between 0 and F-1, inclusive (to avoid perpetual motion);

(2) the values of codeLength0 and codeLength1 must be positive (so that each symbol 0 or 1 corresponds to at least some allowable values);

(3) the values of codeLength0 and codeLength1 must be no greater than JOTS_PER_BYTE (to avoid running beyond the end of the reserve byte while decoding a symbol);

(4) subject to the above criteria, allowable [J]−(allowable [J-codeLength0]+allowable [J-codeLength1]) should be made as small as possible (to minimize data leaks).

Then ladder [i].threshold takes the value allowable− ladder [i].codeLength0+JOTS_PER_BYTE. With F=15 there are but three combinations of codeLength0 and code-Length1 satisfying all the above criteria; these yield the three entries of the table ladder in FIG. 3.

The average person can most likely cite occasions when a glance or a handful of words sufficed to carry volumes of meaning. Such a moment must be considered a formidable accomplishment from the standpoint of data compression. It will be understood that a prerequisite for communication of such high efficiency is a prior high level of empathy between sender and receiver. This is no less true for machines than people; indeed, for machines such a high level of understanding is far more easily attained. One computer program can contain a complete copy of another, if necessary.

The preferred decoding algorithm has already been described. The preferred encoder described herein must use its knowledge of the decoder's inner workings to create a data stream which will manipulate the decoder into producing the desired sequence of decoded symbols.

FIGS. 4 and 5 show procedures for encoding compatible with the decoding procedures of FIG. 3. The tables allowable and ladder and the macro JOTS_PER_BYTE are identical to those used by the decoder.

In rough terms, the preferred encoder operates by considering all possible coded data streams and gradually eliminating those inconsistent with the current state of the decoder ("current" and other adverbs of time used similarly in this discussion should be understood to refer to position in the data stream rather than actual physical time). For the decoder the "allowable" values of the internal buffer form a convenient reference point for discussion; for the encoder we are concerned with the set of values for the coded data stream consistent with the current set of allowable values in the decoder.

As a practical matter, the encoder need not actually consider the entire coded data stream at one time. We preferably partition the coded data stream at any time into three portions (from end to beginning of the data stream): Preactive bytes, which as yet exert no influence over the current state of the decoder; active bytes, which affect the current state of the decoder and have more than one consistent value; This is because the set of possible coded data streams is being repeatedly partitioned, and postactive bytes, which affect the current state of the decoder and have converged to a single consistent value. This is because the set of possible coded data streams is being repeatedly partitioned into subintervals that are determined by the occurrence probability of each successive data value. Each byte of the coded data stream goes from preactive to active to postactive; the earlier a byte's position in the stream, the earlier these transitions occur. A byte is not actually moved to the external file until it becomes postactive. Preferably, only the active portion of the data stream need be considered at any time.

Since the internal buffer of the decoder contains two bytes, there are always at least two active bytes. The variable backlog counts the number of active bytes in excess of two. In theory backlog can take arbitrarily high values, but higher values become exponentially less likely. When backlog takes the value N, there are N+2 active bytes; we number them 0, 1, . . . , N+1 from latest to earliest. The encoder has a variable jotCount matching in value the decoder's variable jotCount at the same point in the data stream.

Regarding the arithmetic operations used for encoding we can think of the N+2 active bytes as forming a single unsigned number with N+2 bytes of precision, byte 0 being least significant and byte N+1 being most significant. The set of allowable values in the decoder at any time form a continuous range; it can be shown that the consistent values of the active bytes in the encoder at any time likewise form a continuous range. Thus we can describe this range simply by its minimum and maximum values, which we denote mathematically by m and M, respectively. Each of these is a nonnegative integer with N bytes of precision; when we wish to refer specifically to byte k of m or M, we will write m(k) or M(k), respectively. Moreover, since the number of elements of the set is given by allowable [JOTS_PER_ BYTE+jotCount], only the minimum value need be specified.

Suppose the value N of backlog is positive. Consider the most-significant active byte, byte (N+1). The minimum consistent value for this byte is m(N+1) and the maximum consistent value is M(N+1). Since this byte is active and not yet postactive, it has more than one consistent value; thus $m(N+1) < M(N+1)$. Let A be the current number of allowable values for the decoder's internal buffer; then $A \leq 2^{16}$ and $M=m+(A-1)$. Note that A−1 can be represented as a two-byte value. If we consider the operation of adding (A−1) to m byte-by-byte to obtain M, we see that a carry must occur from byte 1 to byte 2, and on upward to byte (N+1) for byte (N+1) to take differing values for m and M. Thus m(N+1)+1=M(N+1). And furthermore, if N>1, then m(2), m(3), ..., m(N) must all take the maximum possible value 255 for the carry to propagate from byte 1 to byte (N+1) (and hence M[2], M[3], ..., M[N] all take the minimum possible value 0). In other words, we only need to worry about a backlog larger than one byte if all but the N+1 byte will carry an addition (have a value of 255).

This is convenient; for we need not separately store all N+1bytes of m, but can make the four-byte variable min serve. Bytes 0, 1, and 2 of min represent m(0), m(1), and (when backlog is positive) m(2), respectively. When backlog takes a value N>1, then byte 3 of min represents m(N+1). Moreover, most of the arithmetic operations to be performed on m can be performed on min in a completely ordinary way. The exceptions can be recognized because they require the manipulation of backlog.

Having concluded these rather lengthy preliminaries, let us now consider the arithmetic operations entailed in encoding a symbol. Recall the sequence of events in the decoder attending the decoding of the symbol 0. Initially, internalBuffer has one of allowable [JOTS_PER_BYTE+jotCount] values. The decoder compares internalBuffer to ladder [rung].threshold [jotCount]; a 0 is decoded if internalBuffer holds the lesser value. Then ladder [rung].codeLength0 is subtracted from jotCount, reflecting the newly decreased number of allowable values for internalBuffer. Note that the allowable values eliminated are all taken from the top of the range (those greater than ladder [rung]. threshold [jotCount]). Thus m does not change; and the encoder need not modify min or backlog but only jotCount.

To encode the symbol 1: The chief difference in the sequence of events in the decoder, as compared to the case for 0, is that those values representing 0, numbering ladder [rung].threshold [jotCount], are eliminated from the bottom of the range of consistent values for the coded data stream. Some additional values may be eliminated from the top of the range as well, if there is a data leak. Thus the encoder, as well as changing the value of jotCount to track its value in the decoder, must add ladder [rung]. threshold [jotCount] to min to raise m. Since the present invention does not represent M directly, eliminating consistent values from the top of the range takes care of itself. The unusual format by which min represents m never becomes an issue in encodeBit( ).

When the value of jotCount dips to zero or lower, the encoder calls the procedure encodeExport ( ). In contrast to decodeImport ( ), which invariably reads a single byte from the external file, encodeExport ( ) writes from zero to several bytes in a single call. One of its functions is to determine whether the most-significant active bytes have yet converged to a unique consistent value, thus becoming postactive and hence ready to be exported to the encoder's external file. That is, encodeExport ( ) outputs the most significant digits of the compression result number, that can no longer change due to further narrowing of the subinterval. These most-significant bytes may actually converge to a unique consistent value well before encodeExport ( ) is called, but there is no harm in waiting until then to check. On each call, encodeExport ( ) moves a single byte from the preactive to the active portion of the coded data stream. The format by which min represents m does become an issue in encodeExport ( ); we must manipulate backlog and min together.

The foregoing sections describe an encoder and decoder for entropy coding; however, powerful operations of data modeling (representing symbol probabilities) can be incorporated in a natural way into the encoder and decoder using the developer's own sophisticated model for the particular type of data involved.

Earlier we commented that the two main sources of compression inefficiency in the preferred encoder are data leaks and misestimates of probabilities. We now provide some rules of thumb for estimating the compression inefficiency due to the latter in any entropy coder.

Data compression theory teaches that the shortest possible expected code length for a binary symbol taking the value 1 or 0 with probability p or (1−p), respectively, is achieved by using a code of length $\log_{0.5} p$ bits for 1 and a code of length $\log_{0.5}(1-p)$ bits for 0. The resulting optimum expected code length (the entropy of the symbol) is $(1-p)\log_{0.5}(1-p) + p\log_{0.5} p$ bits. Suppose we estimate p by $p'=p+\epsilon$ with an error of $\epsilon$; then we would use code lengths for 0 and 1 of $\log_{0.5}(1-p-\epsilon)$ and $\log_{0.5}(p+\epsilon)$; the resulting expected code length is $(1-p)\log_{0.5}(1-p-\epsilon)+p\log_{0.5}(p+\epsilon)$. Using a power series representation for the logarithm, it can be shown that for small values of $\epsilon$ the expected code length is approximately $$\frac{\epsilon^2}{p(1-p)\log 2}$$

bits per symbol greater than optimum.

This depends on p; at times it is more convenient to work with the probability angle $\alpha$ such that $p=\sin^2\alpha$ and $1-p=\cos^2\alpha$. Then an error of $\eta$ radians in the probability angle entails a compression inefficiency of approximately $$\frac{2\eta^2}{\log 2}$$

bits per symbol-independent of $\alpha$.

In a real-world application, it can be quite difficult to estimate the probabilities for a particular symbol. One approach is to examine the history of symbols which appeared in similar contexts (this determination of "context" is part of the modeling problem; the example programs COMPRESS, in FIGS. 33 and 34, and EXPAND, in FIGS. 35 and 36, provide an illustration). On the $(t+1)^{th}$ occurrence of a particular context, we create an estimate $P_{t+1}$ for the probability p that the symbol takes the value 1 by averaging its values over previous occurrences:

$$P_{t+1}=(1/t)(\sigma_1+\sigma_2+\ldots+\sigma_t),$$

where $\sigma_u$ represents the value of the symbol on the $u^{th}$ occurrence of this context.

Such an approach may be improved upon if the value of $u_p$ shifts over time. For example, in compressing the Bible, one would find that "Moses" occurs more frequently than "Peter" in the Old Testament, while the opposite is true in the New Testament. Therefore we preferably weight recent occurrences of a given context more heavily. For example, we could use geometrically decreasing weights to create and estimate $P_{t+1}$ for p:

$$P_{t+1}=s(\sigma_t+(1-s)\sigma_{t-1}+(1-s)^2\sigma_{t-2}+\ldots),$$

s being a parameter between 0 and 1. We have simplified matters by assuming that the context has occurred infinitely many times already; the weights given to occurrences in the distant past are very small anyway. The greater the value of s, the more heavily more recent occurrences of a context are weighted, and thus the more rapidly $P_{t+1}$ reflects changes in p. We therefore call s the speed of adaption.

Higher speeds of adaptation better recognize shifting probabilities, but there is an attendant disadvantage. Small speeds of adaptation are akin to calculating an average over a large sample, while large values of speed calculate an average over a small sample. Aside from shifts in the value of p, we would expect our estimate to be more accurate as the sample is larger. Indeed, assuming the symbols $\sigma_u$ are independent (a reasonable assumption, since dependence indicates an unexploited opportunity for the modeling scheme, that is, a modeling flaw), and ignoring shifts in the value of p, statistics theory indicates that the mean-squared error in our estimate $P_{t+1}$ for p is given by $$\epsilon^2 = (s/(2-s))p(1-p),$$

increasing as s increases. In light of the above code length formula, the corresponding coding inefficiency is $$\frac{s}{(2-s)\log 2}$$

bits per symbol (conveniently independent of p).

This dichotomy is of fundamental importance in real-world data compression problems. In estimating probabilities associated with a particular type of data, often one's only recourse is to judge empirically based on the data previously seen. One must decide how much additional importance should be accorded to more recent data. If recent data is weighted heavily, then the accuracy of the estimate suffers because one is estimating from a small sample. If recent data is not weighted heavily, then the accuracy of the estimate may suffer because one's estimate will be slow to reflect shifts in the true probability. The state of the art in modeling many real-world classes of data is such that the probability estimate presented to the entropy coder should often be regarded as rather haphazard.

This gloomy state of affairs is not completely without its consolations. Suppose the probability estimate presented to an entropy coder (of whatever variety) has some significant error. If, due to its own limitations, the entropy coder cannot reproduce the requested probability value exactly, this is as likely to improve compression as to worsen it. Other types of coding inaccuracies may also pale in severity in the face of this fundamental difficulty of probability estimation. Thus the real world can be surprisingly forgiving of minor inefficiencies in an entropy coder, particularly of those related to probability values.

Though the more sophisticated of the two, the second formula given above can be more rapidly computed in practice. Note that from it we can derive:

$$P_{t+1} = s\sigma_t + (1-s)P_t;$$

i.e., $$P_{t+1} = (1-s)P_t \text{ if } \sigma_t = 0, \text{ or } (1-s)P_t + s \text{ if } \sigma_t = 1$$

In software, this can be implemented by a pair of lookup tables giving $P_{t+1}$ as a function of $P_t$, depending on whether the last symbol for the given context was 0 or 1. We cannot treat $P_t$ as a floating-point value but must restrict it to a discrete set. However, a relatively modest collection of values for $P_t$ can provide excellent coding efficiency. For example, consider 90 values, distributed between 0 and 1 so that the corresponding probability angles are evenly spaced between 0 and 90°. Then the error in probability angle need never exceed 0.5°. From the compression inefficiency formula above, we find the corresponding coding inefficiency to be 0.0002197 bits per symbol. This is the error due to the discretization of p; as noted above, this is likely to be insignificant compared to coding inefficiencies from other effects.

FIG. 6 illustrates the incorporation of these lookup tables into the present invention. We have added two elements (next0 and next1) to the structures making up the table ladder [], indicating the next value of the first argument to the procedures decodeBit ( ) and encodeBit ( ), if the current symbol is 0 or 1, respectively. Here can be seen the origin of our nomenclature ladder []; we think of the elements of this table as rungs of a ladder, which we ascend and descend as the probability associated with the context rises and falls; alternatively next0 and next1 can be thought of as operating to adapt occurrence probabilities to actual occurrences by shifting the ladder in a probability dimension. The procedures decodeBit ( ) and encodeBit ( ) now must modify the value of their first argument, so it is no longer appropriate to pass it by value. The procedures decodeBit ( ) and encodeBit ( ) now modify the value of the index into ladder []; thus the parameter rung is now of type unsigned char* rather than unsigned char and is a pointer to this index rather than representing the index directly.

The foregoing assumes that probabilities are updated once for every symbol coded. A slight modification of the described technique is to update the probabilities only when the decoder imports data or the encoder exports data (i.e., in the procedures decodeImport ( ) and encodeExport ( ) of our examples). This should provide faster coding, since the update operation is performed less often, but could decrease coding efficiency, since the probabilities are estimated from a more restricted sample. This approach is appealing from the standpoint that probabilities are modified more often when compression is poor, since in that case bytes are imported more frequently. Our name for this variant is inalacritous updating, the other method being of course alacritous. The sample listings starting in FIG. 13 embody both approaches, distinguished by compile switches.

Inalacritous updating requires a different set of look-up tables for the probability ladder, since bytes are more likely to be imported during the coding of certain symbols than others. The updating formula, above, for determining $P_{t+1}$, indicates that the probability estimate increases by $\Delta p_1 = s(1-P)$ when the coded symbol is 1 and decreases by $\Delta p_0 = -sP_t$ when the coded symbol is 0; note that $\Delta p_1 - \Delta p_0 = s$. Thus the ratio of these two step sizes is $\Delta P_1/\Delta P_0 = -(1-P_t)/P_t$. If a given element of the table ladder [] has values $L_0$ for codeLength0 and $L_1$ for codeLength1, then the probability of importing a byte when 0 is coded is $L_0/F$ and the probability of importing a byte when 1 is coded is $L_1/F$. To compensate, we therefore adjust the ratio of the two step sizes to $$\Delta p°_1/\Delta p°_0 = (\Delta p_1/\Delta p_0) ((L_0/F)/(L_1/F)) = -(((1-p_t)L_0)/(p_tL_1))$$

If we define the speed s to be $\Delta p°_1 - \Delta p°_0$ as previously, then we obtain $$\Delta p°_0 = \frac{-sp_tL_1}{(1-p_t)L_0 + p_tL_1}$$

$$\Delta p°_1 = \frac{s(1-p_t)L_0}{(1-p_t)L_0 + p_tL_1}$$

For $P_t$ near 0 or 1, we may need to restrict s to small values lest $P_t + \Delta p_{0 < 0}$ or $P_t + \Delta P_{1 > 1}$. The accompanying sample listings include complete examples of both types of probability ladder.

Listings for four files (elscoder.h, elscoder.c, compress.c and expand.c) are given in FIGS. 13–36. The files elscoder.h and elscoder.c contain declarations and definitions for a preferred implementation of the present invention, respectively. The files compress.c and expand.c are sample programs which use the principles of the present invention to compress and expand a file using a one-byte model.

Figure 7:
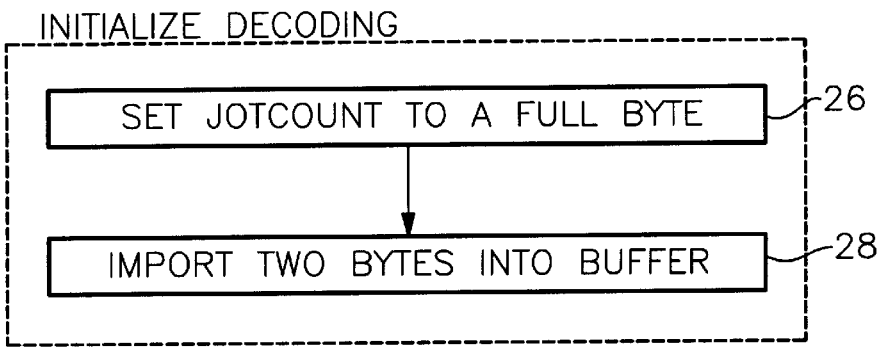
FIG. 7 is a flowchart illustrating the operation of decoding initialization of a preferred embodiment of the present invention.

Flowcharts illustrating the operation of the sample listings are given in FIGS. 7–12. FIG. 7 illustrates the operation of procedure elsDecodeStart in FIG. 28. A positive value of jotCount indicates that the reserve byte is full and that there is data in the working byte. Thus, JotCount is set to a full byte (JOTS_PER_BYTE) 26, and then internalBuffer is filled with two imported bytes 28.

Figure 8:
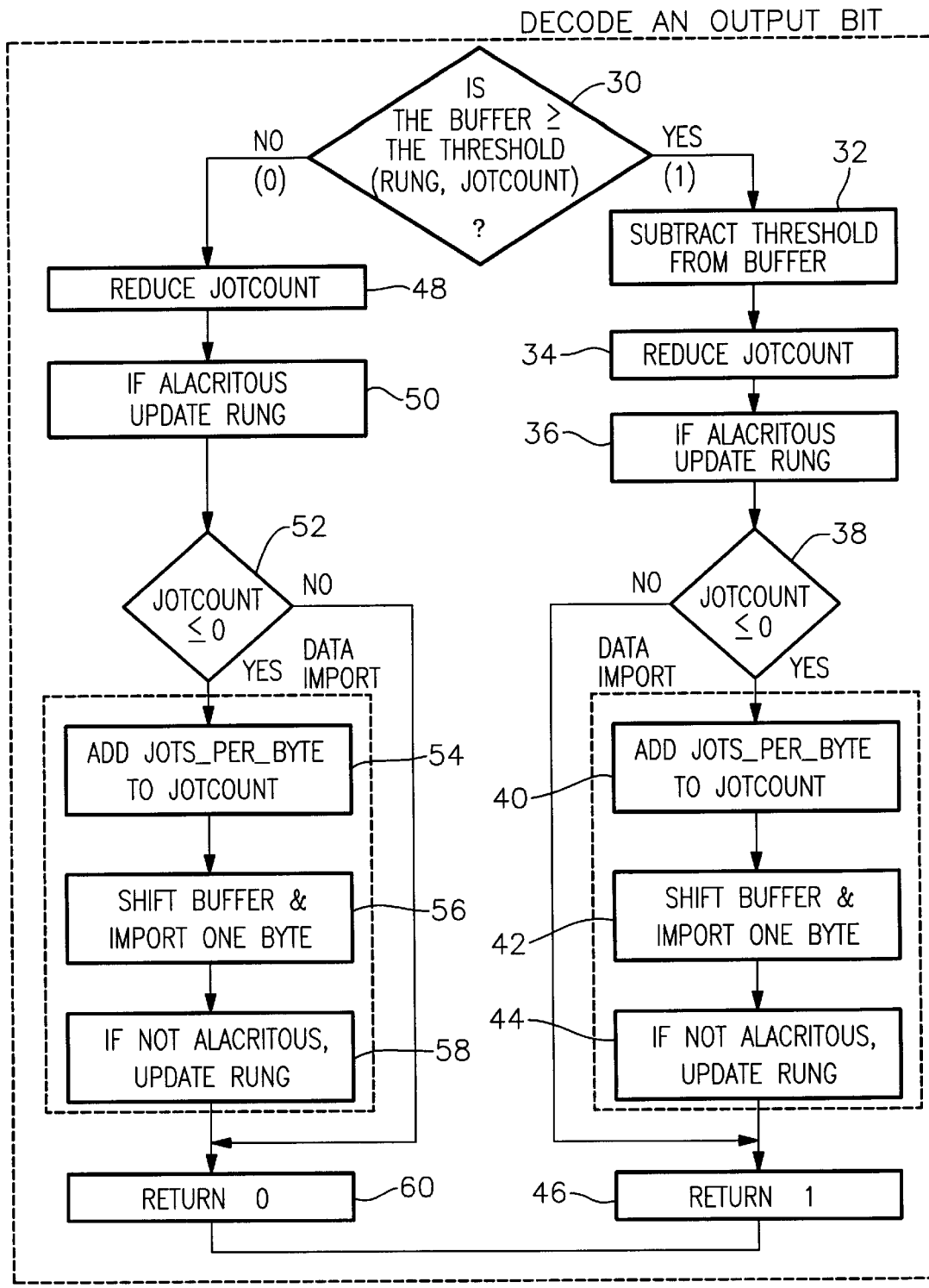
FIG. 8 is a flowchart illustrating decoding an output bit.

FIG. 8 illustrates the operation of procedure elsDecodeBit, shown in FIGS. 28 and 29. First the value of internalBuffer is tested against the threshold table entry for the present rung and jotCount value 30. If internalBuffer is greater than or equal to the threshold, then the threshold is subtracted from the buffer 32, jotcount is reduced by codeLength1 34, and the rung is updated to the next1 value, if ALACRITOUS was defined 36. If jotCount is zero or less 38, then JOTS_PER_BYTE is added to jotCount 40 to show that internalBuffer is shifted and another byte is imported 42. If ALACRITOUS was not defined, then rung is updated as above 44; because the present operation is inalacritous, this results in an update of rung only when a byte is imported. Then a result of 1 (that is, a decoded bit having a value of "1") is output 46. If, however, jotCount was strictly positive in 38, then only 46 is executed.

If the value of internalBuffer is less than the threshold in 30, jotCount is reduced 48 and the rung updated to the next0 value if ALACRITOUS was defined 50. Data import is similar to that described above, namely, if jotCount is zero or less (signifying a depleted working byte) 52, then JOTS_PER_BYTE is added to jotCount 54 to show that internalBuffer is shifted and another byte is imported 56. If ALACRITOUS was not defined, then rung is updated as above 58. Then a result of 0 (that is, a decoded bit having a value of "0") is output 60. Again, if jotCount was strictly positive in 52, then 60 is executed. After a "0" or "1" is returned the procedure ends.

Figure 9:
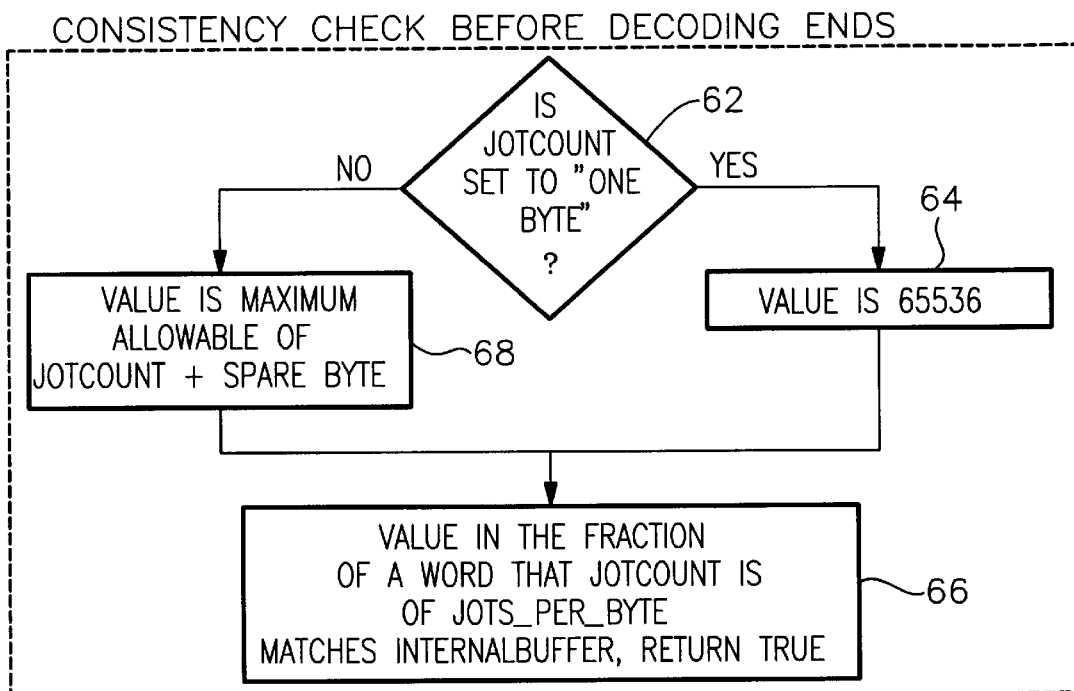
FIG. 9 is a flowchart illustrating a consistency check before decoding ends.

FIG. 9 illustrates the consistency check encoded at the end of a compressed data stream, embodied in the procedure elsDecodeOk in FIG. 29. If jotCount equals JOTS_PER_BYTE 62, that is, the working byte is full, then true is returned if the value of 65536 in the fraction of a word that is available matches the contents of internal buffer 66. Otherwise, the maximum allowable value of jotCount and the reserve byte 68 is returned as above.

Figure 10:
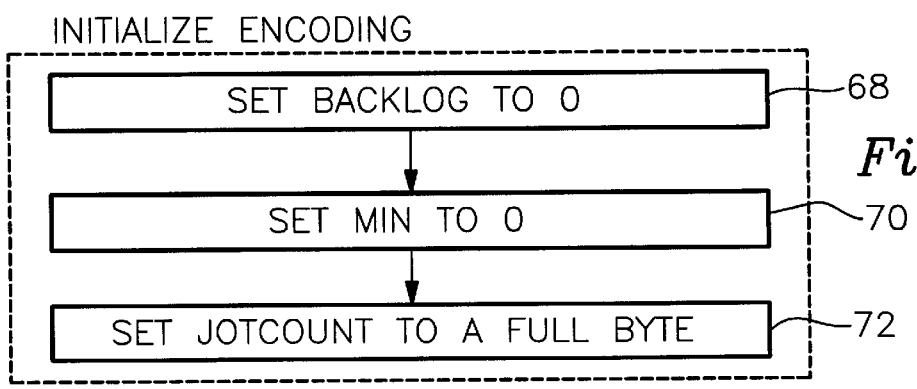
FIG. 10 is a flowchart illustrating the operation of initializing encoding.

FIG. 10 illustrates the operation of procedure elsEncodeStart, given in FIG. 30. Because there are no postactive bytes yet, the backlog is set to zero 68; similarly, because there has been no decoding yet, the minimum consistent value m is set to zero 70. Since the encoder must mirror the operation of the above decoder, and must know the state of the decoder, jotCount is set to a full byte 72.

Figure 11A:
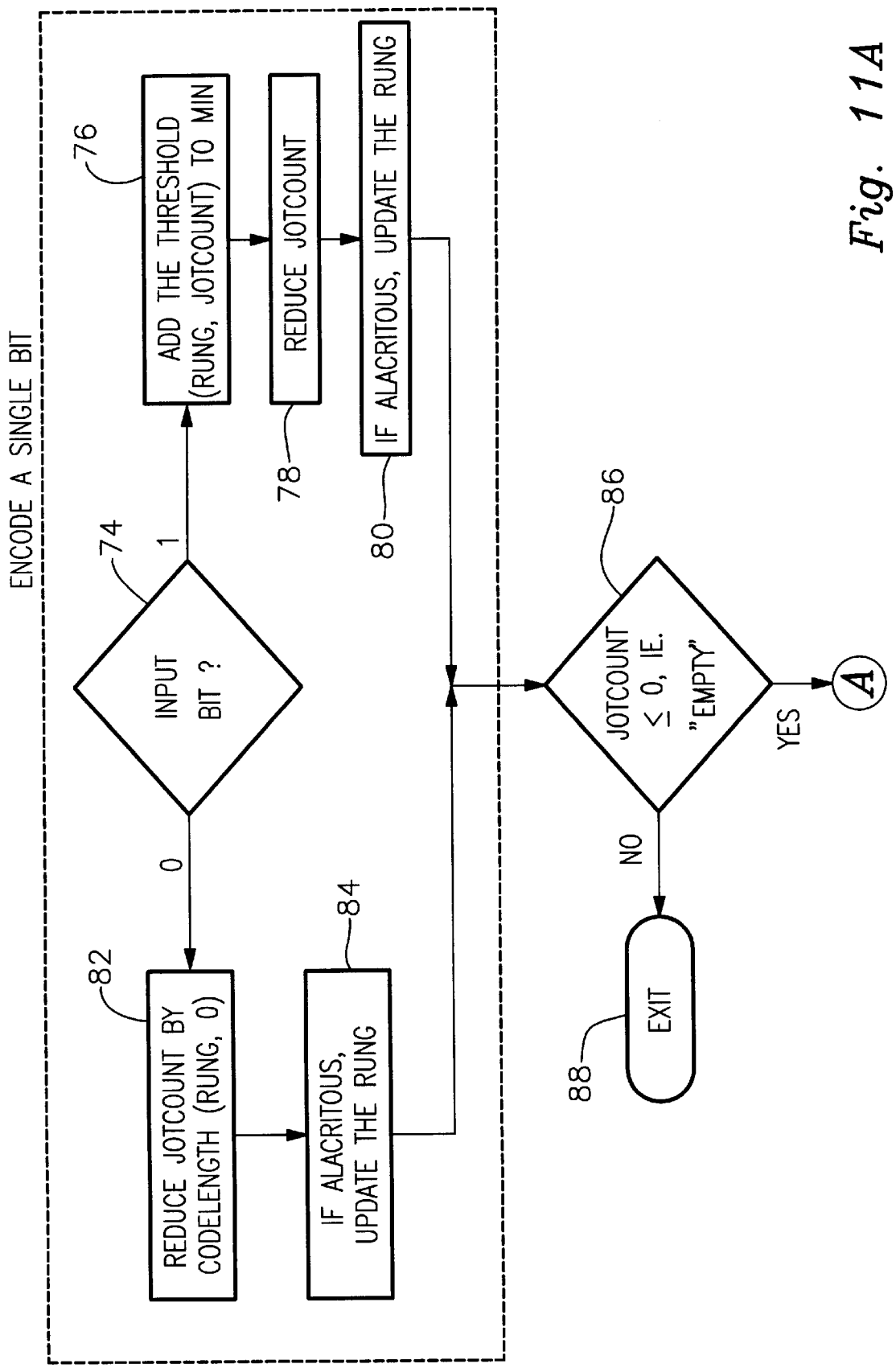
FIG. 11 is a flowchart illustrating encoding a single bit, output, if necessary, of one or several byte(s), and making room for one byte.
Figure 11B:
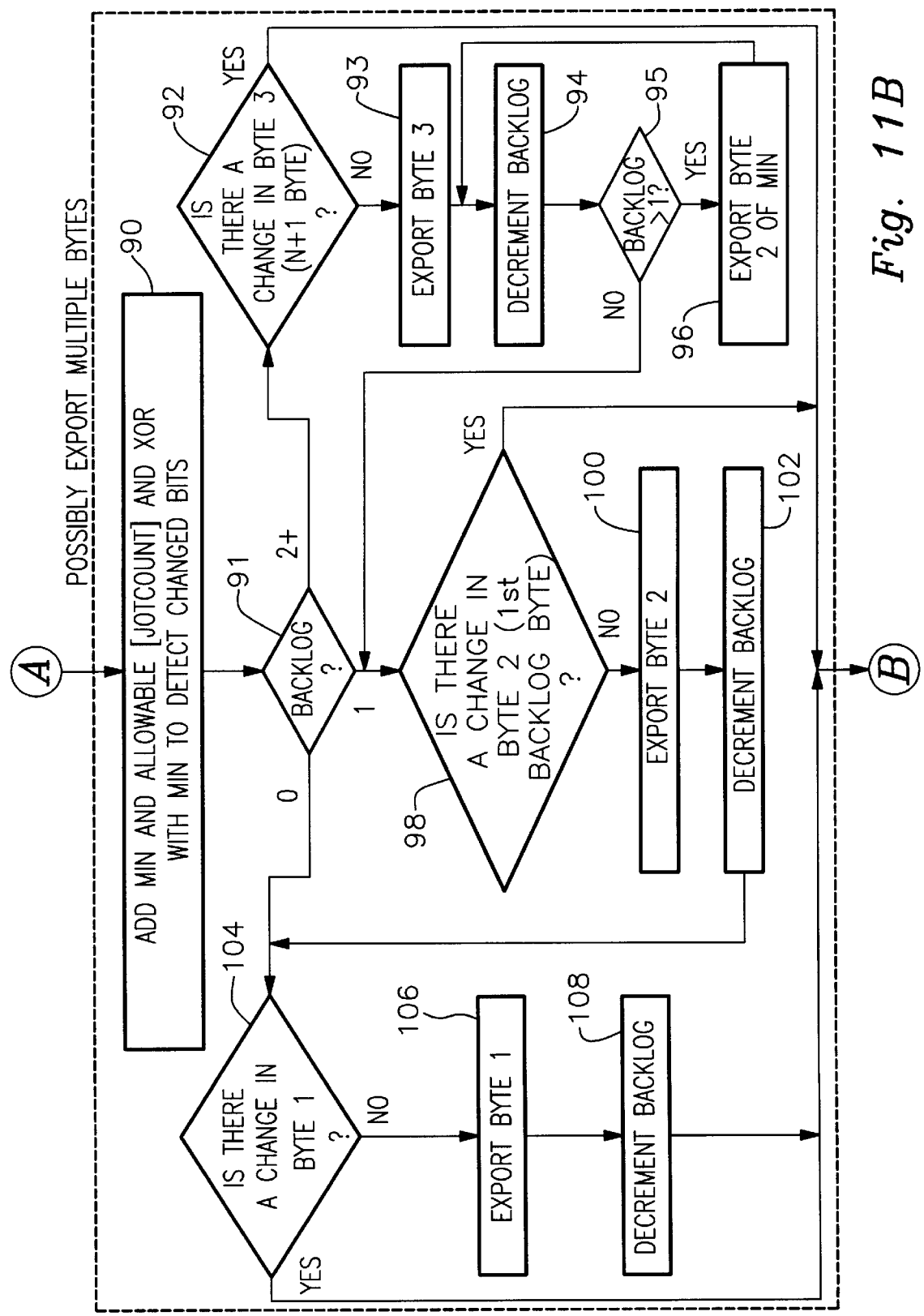
Figure 11C:
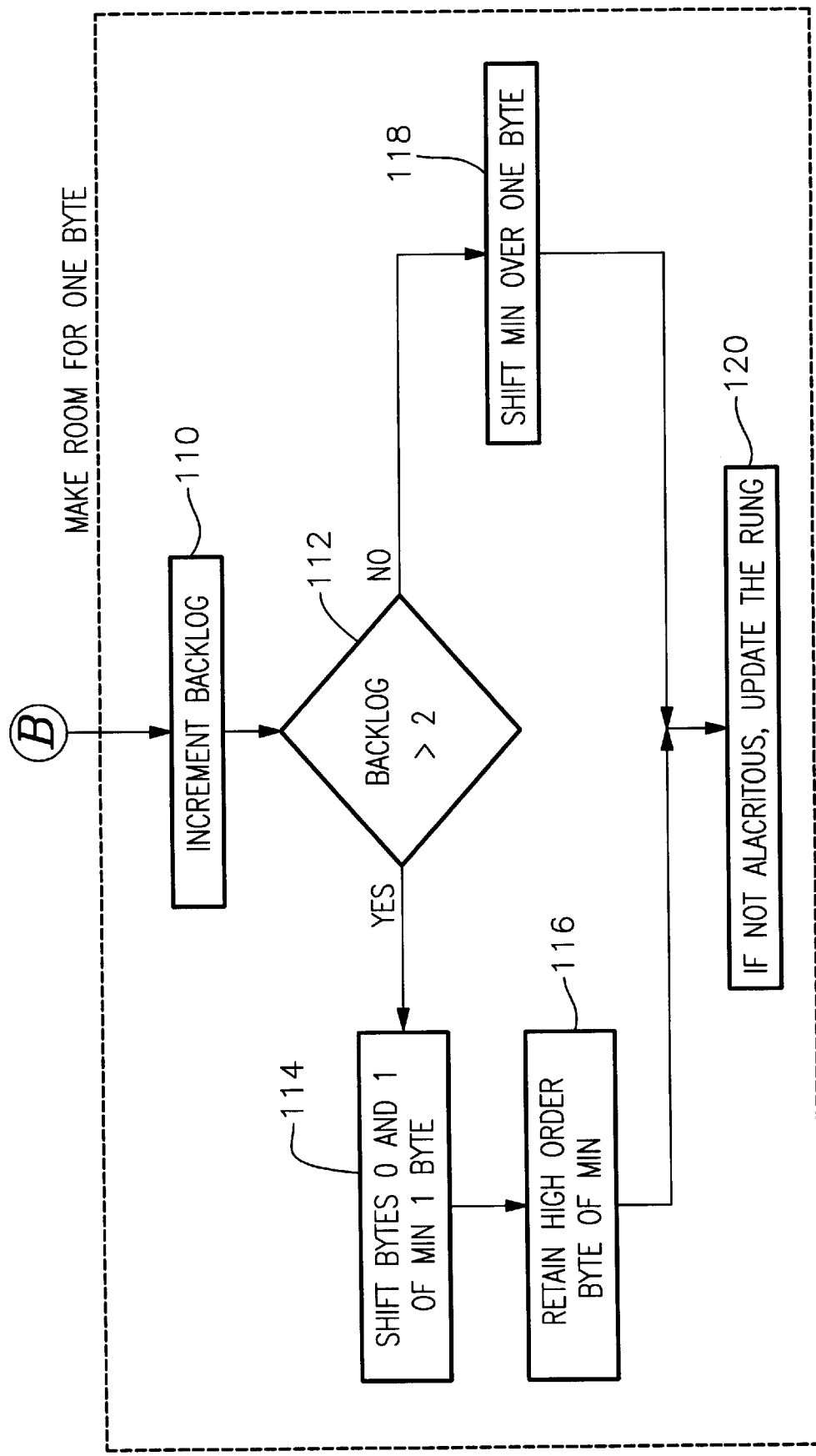

FIG. 11 is a flowchart of the operation of procedure elsEncodeBit, listed in FIGS. 30–31. The procedure is called with a single bit, which is tested 74. If the bit is a "1, " then the threshold corresponding to the present value of rung and jotCount is added to the minimum consistent value 76, jotCount is reduced by the codeLength1 for the present rung 78, and the rung is updated as above if ALACRITOUS is defined 80. Conversely, if the input bit was a "0," jotCount is reduced by the codeLength0 for the present rung 82, and the rung is updated if ALACRITOUS is defined 84.

Then the procedure checks whether jotCount is less than or equal to zero (that is, the working byte in the decoder would be empty) 86. If not, then the procedure ends 88. If yes, the minimum and minimum plus allowable values are exclusive OR'd with each other to determine if there is a carry 90. This will be used later to force the encoder to keep all bytes until there is no change, that is, until some bytes have converged to a consistent value (are post-active). Then the value of backlog is tested 91. If it is two or greater, then the program checks whether byte 3 (the m[N+1] byte) has changed 92. If it has, then execution of this program unit, which possibly exports multiple bytes, terminates as described below, because the oldest backlog byte still has not converged, and more recent bytes similarly will not have done so. If byte 3 did not change, then byte 3 is exported 93 and a loop is started in which backlog is decremented 94 and then tested whether it is still greater than 1 (i.e., the program may still have to export byte 2 multiple times) 95. If yes, then byte 2 of min is exported 96 and execution returns to 94. If no, or if backlog was one in 91, then the program checks whether byte 2 of backlog (the first backlog byte) changed 98. If it did, then once again this program unit terminates as described below. If not, then byte 2 is exported 100, and backlog is decremented to reflect this export 102.

Then, or if backlog was zero in 91, the program checks whether byte 1 changed 104. If it did, then execution of this program unit terminates. Otherwise, the program exports byte 1 106 and decrements backlog 108 to reflect this.

Then, or if execution of the program unit terminated following the yes branch from any of 92, 98, or 104, backlog is once again incremented 110 because a byte is about to be "imported." If backlog is greater than two 112, then bytes 0 and 1 of min are shifted 114, but the high order byte of min (byte 3) is retained 116. Otherwise, min is shifted over by one byte 118. In either case, the rung is updated if ALACRITOUS was not defined 120.

Figure 12:
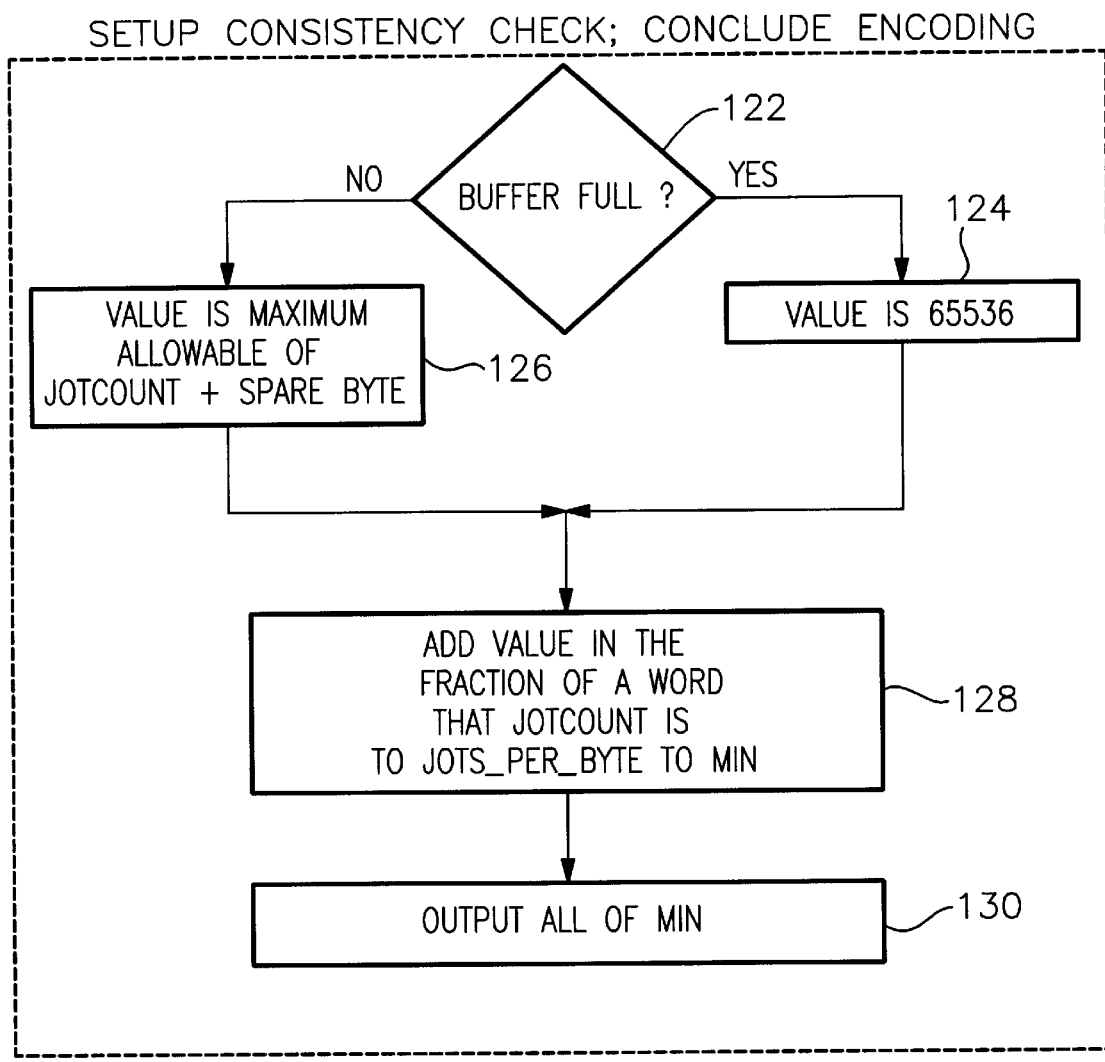
FIG. 12 is a flowchart illustrating a consistency check before decoding ends.

FIG. 12 is a flowchart of the execution of elsEncodeEnd given in FIGS. 31 and 32. The operation can be expected to be a mirror to the operation described above and shown in FIG. 9. If the buffer is full 122 then a value is set to 65536 124; otherwise it is set to the maximum allowable value, based on jotCount and the reserve byte 126. The value is then added to min, in the fraction of a word that jotCount is of JOTS_PER_BYTE 128. The updated value of min is then output.

The code fragments given as examples in the previous sections were designed more for pedagogical value than utility. The sample programs represent a compromise between these two goals with more emphasis on utility. The reader will note the following changes:

(1) The variables describing the states of the decoder and encoder have been collected into structures named d and e, respectively.

(2) Globally visible names in the coder have been prefixed by els, Els, or ELS, to help prevent namespace collisions.

(3) The procedures decodeImport ( ) and encodeExport ( ) have been eliminated and the corresponding operations incorporated directly into elsDecodeBit ( ) and elsEncodeBit ( ).

(4) The value of JOTS_PER_BYTE has been increased from 15 to 754. The value 754 represents a sort of local optimum. Although higher values for JOTS_PER_BYTE generally yield better coding efficiency, the vagaries of the ladder constraints listed above dictate that higher compression ratios are attainable for the value 754 than for 755 and subsequent higher values up to around 1508.

The file elscoder.c includes straightforward procedures elsDecodeStart ( ) and elsEncodeStart ( ) for initializing and elsDecodeEnd ( ) and elsEncodeEnd ( ) for terminating encoding and decoding. One can choose alacritous or inalacritous probability updating in the coder by defining or not defining ALACRITOUS in compiling elscoder.c.

The sample files also incorporate some enhancements to the principles of the present invention described in the previous sections:

First: Although the entropy-coding algorithm works with units of data smaller than a bit, most likely the source and destination files must have lengths that are multiples of a byte. Thus a file coded using the principles of the present invention is likely to end with a fraction of a byte not containing meaningful data. The sample ELS-coder attempts to make a virtue of necessity by using this empty portion to encode something akin to a checksum. When encoding is concluded, a certain number of consistent values remain in the encoder; these are used to store the value of jotCount to whatever precision is possible. This is done automatically in the procedure elsEncodeEnd ( ). If desired, the user can call the function elsDecodeOk( ) when finished decoding but before calling elsDecodeEnd ( ); this will verify that the value of jotCount matches that sent by the encoder. The preferred embodiment of the present invention is such that any corruption of the compressed data will most likely profoundly alter the course of execution of the decoder; the probability of ending with the same value of jotCount is quite small. Of course, this value is only encoded to the precision possible with the fraction of a byte remaining at the end of coding; thus the probability of hitting the correct value by chance ranges from 1 in 255 to 1, depending on what that fraction is.

Second: Recall that our design of the probability state ladder (in both the alacritous and non-alacritous cases) assumes that any given context has already occurred infinitely many times. This assumption is least tenable near the beginning of the coding process. It seems appropriate to use smaller samples to estimate probabilities (i.e., to use greater speeds of adaptation) early in the coding process and larger samples (lesser speeds of adaptation) later in the process. This has been achieved by incorporating transient states into the probability ladder; these are states which can be visited at most once early in the coding process and never again thereafter.

Consider for example the alacritous probability ladder. The initial rung is at index 0 and has probability 0.5 (for convenience, the index and probability value corresponding to each rung of the probability ladder are listed in a comment preceding the initializer for that rung). State 0 is followed by rung 1 or 2, with probabilities of 0.33333 or 0.66667, respectively. The speed of rung 0 is equal to the difference between these values, or 0.33333. Rungs 1 and 2 are followed by rungs 3, 4, 5, 6; the speed for rungs I and 2 is given by, for example, the difference between the probability values for rungs 3 and 4, or 0.29. Similarly, rungs 3, 4, 5, and 6, are followed by rungs 7, . . . , 14, which are in turn followed by rungs 15, . . . , 30, which are in turn followed by rungs 31, . . . , 62, which are in turn followed by rungs 63,. . . , 126. The speed decreases at each step, from 0.33333 to 0.29 to 0.24667 to 0.20333 to 0.16 to 0.11667 to 0.07333. From one of rungs 63,. . . , 126 the coder transits to one of rungs 127, . . . , 254; these form the permanent part of the ladder; these rungs can be visited repeatedly. The speed for the permanent rungs is 0.03. All given speeds and number of rungs may be optimized further for any application. The given speeds and divisions of speeds are merely the preferred embodiment and are not intended to be exclusive.

The inalacritous probability ladder likewise preferably consists of 127 transient rungs and 128 permanent rungs.

The values of speed used here are by no means sacred (although some theoretical argument can be made for an initial value of ⅓); the best value of speed for the permanent rungs depends on the nature of the data being compressed. Nor is it required to have 127 transient rungs and 128 permanent rungs; we simply chose values totaling to almost 256 to get the most mileage out of the unsigned char serving as an index into the ladder.

Third: Rung 255 (of either ladder) does not represent a probability state, but is available for use as an "inactive" state. The only really important components of this rung are codeLength 0 and codeLength 1, both set to 2*JOTS_PER_BYTE+. This value is guaranteed to trigger an import operation; moreover the value of jotCount remains negative even after the addition of JOTS_PER_BYTE. Both encoder and decoder are equipped to recognize this as an error condition.

The example shell programs compress.c and expand.c illustrate the use of various contexts for modeling. In this case the model is a one-byte model. For example, if compressing English text, the model exploits the fact that 'e' occurs more frequently than 'u,' but not the fact that 'u' occurs more frequently than 'e' following 'q'; it represents frequencies for each byte but not relationships between different bytes. This model is described by a state machine, each state holding a probability rung. Each state of the machine corresponds to a particular context. For example, the first bit of a byte is one of these contexts. The last bit of a byte corresponds to 128 different contexts, depending on the values of the preceding seven bits. Any model to be used with the present invention or similar coders handling only binary symbols must be expressed as such a state machine.

This one-byte model requires 255 states (stored in the table context []), organized in a tree fashion similar to the transient rungs of the probability ladder—we number these from 1 to 255. State 1 is used for the first bit of any byte. State 2 is used for the second bit of a byte if the first bit was 0; state 3 is used for the second bit of a byte if the first bit was 1. In general, state 2n is used for the next bit of a byte if the preceding bit corresponding to state n was 0, while state 2n+1 is used for the next bit of a byte if the preceding bit corresponding to state n was 1. This arrangement of states also makes for straightforward calculation of state transitions, so storing the values of successor states in unnecessary. Such a tree of probabilities is equivalent to storing the probabilities for all 256 byte values.

The entry context [0] has not been used in any of the above; we use it to identify a 257th symbol serving as an end-of file marker. We represent the byte value 255 by the sequence of nine bits 111111110; the end-of file marker is the nine-bit sequence 111111111. The state context [0] is used for the final bit of this sequence. Both compress.c and expand.c must take special action in the case of a byte with value 255.

In a preferred embodiment operating on a PC, one can compress the file raw to compressed by the command compress raw compressed Subsequently one can expand the file compressed to expanded by the command expand compressed expanded The files raw and expanded should then be identical.

The preferred embodiment described above may be replaced by any other implementation consistent with the principles described and illustrated; contemplated changes comprise maintaining status registers such as jotCount in real numbers or integers with greater precision, allowing larger values of jotCount and larger internalBuffer sizes for greater efficiency and reduced data leaks; use of a word rather than a byte for the working data; increase of JOTS_PER_BYTE to higher values that reduce or eliminate data leaks; and tuning the ladder to a particular application to optimize the speed of adaptation.

What is claimed is:

1. A method of manipulating a series of data units comprising distinct data values comprising the step of:
modelling the occurrence probability of each distinct data value;
repeatedly performing, the steps of
subdividing a byte into at least nine units, each of said units corresponding to one occurrence of a theoretically most probable data value;
narrowing a manipulation result number using, said units into a subinterval determined by the occurrence probability for each successive data value; and
outputting the more significant digits of the manipulation result number that can no longer change due to further narrowing,
such that the sequence of said output digits comprise the manipulated data.

2. A method of manipulating a series of data units comprising distinct data values comprising the steps of:
modelling the occurrence probability of each distinct data value;
repeatedly performing the steps of
narrowing a manipulation result number using a table into a subinterval determined by the occurrence probability for each successive data value; and
outputting the more significant digits of the manipulation result number that can no longer change due to further narrowing,
such that the sequence of said output digits comprise the manipulated data.

3. The method of claim 2, further comprising the step of adapting said occurrence probabilities to actual occurrences in said series by shifting said table in a probability dimension.

4. A method of manipulating a series of data units comprising distinct data values comprising the steps of:
modelling the occurrence probability of each distinct data value;
repeatedly performing the steps of
narrowing a manipulation result number into a subinterval determined by the occurrence probability for each successive data value; and
outputting the more significant digits of the manipulation result number that can no longer change due to further narrowing in units of at least one byte,
such that the sequence of said output digits comprise the manipulated data.

5. A method of manipulating a series of data units comprising distinct data values comprising the steps of:
modelling the occurrence probability of each distinct data value;
repeatedly performing the steps of
narrowing a manipulation result number outside a subinterval determined by the occurrence probability for each successive data value, whereby control information is encoded in said manipulated data; and
outputting the more significant digits of the manipulation result number that can no longer change due to further narrowing,
such that the sequence of said output digits comprise the manipulated data.

6. The method of claim 1, further comprising the steps of:
converting said occurrence probability to a subinterval using a table, for each successive data value;
adapting said occurrence probabilities to actual occurrences in said series by shifting said table in a probability dimension; and
outputting said more significant digits in units of at least one byte.

7. An apparatus for manipulating a series of data units comprising distinct data values, further comprising:
means for modelling the occurrence probability of each distinct data value;
means for subdividing a byte into at least nine units, each of said units corresponding to one occurrence of a theoretically most probable data value;
means for narrowing a manipulation result number into a subinterval determined by the occurrence probability for each successive data value; and
means for outputting the more significant digits of the manipulation result number that can no longer change due to further narrowing, such that the sequence of said output digits comprise the manipulated data.

8. An apparatus for manipulating a series of data units comprising distinct data values, comprising:
means for modelling the occurrence probability of each distinct data value;
means for narrowing a manipulation result number using a table into a subinterval determined by the occurrence probability for each successive data value; and
means for outputting the more significant digits of the manipulation result number that can no longer change due to further narrowing, such that the sequence of said output digits comprise the manipulated data.

9. The apparatus of claim 8, further comprising means for adapting said occurrence probabilities to actual occurrences in said series by shifting said table in a probability dimension.

10. An apparatus for manipulating a series of data units comprising distinct data values, comprising:
means for modelling the occurrence probability of each distinct data value;
means for narrowing a manipulation result number into a subinterval determined by the occurrence probability for each successive data value; and
means for outputting the more significant digits of the manipulation result number that can no longer change due to further narrowing in units of at least one byte, such that the sequence of said output digits comprise the manipulated data.

11. An apparatus for manipulating a series of data units comprising distinct data values, comprising:
means for modelling the occurrence probability of each distinct data value;
means for narrowing a manipulation result number outside a subinterval determined by the occurrence probability for each successive data value, whereby control information is encoded in said manipulated data; and
means for outputting the more significant digits of the manipulation result number that can no longer change due to further narrowing, such that the sequence of said output digits comprise the manipulated data.

12. The apparatus of claim 7, further comprising:

means for converting said occurrence probability to a subinterval using a table, for each successive data value;

means for adapting said occurrence probabilities to actual occurrences in said series by shifting said table in a probability dimension; and means for outputting said more significant digits in units of at least one byte.

13. A method of compressing a data stream expressed as a sequence of binary-decision signals comprising, for each such signal, the steps of:

storing a minimum consistent value;

storing a data counter value;

storing a plurality of first and a plurality of second code-length values;

identifying one of said first code-length values as the current one, and identifying one of said second code-length values as the current one;

calculating a threshold value based on said data counter value and said current identified first and second code-length values;

updating said minimum consistent value by adding said threshold value in response to the binary-decision signal;

increasing said data-counter value;

outputting data, such that said data comprises a compressed data stream; and updating said consistent minimum value in response to said data-counter value dropping below a predetermined minimum.

14. The method of compressing the data stream of claim 13, further comprising expanding the compressed data stream, further comprising the steps of:

storing an internal buffer value;

comparing said internal buffer value with said threshold value and generating an expanded binary-decision signal in response to said comparison;

updating said data counter value by subtracting either said current identified first code-length value or said current identified second code-length value, in response to said comparison;

updating said internal buffer value in response to said comparison;

increasing said data counter value and updating said internal buffer value using said internal buffer value and data from said output data in response to the data counter value dropping below a prescribed minimum.

15. A method of expanding a data stream comprising the steps of:

storing an internal buffer value;

calculating a threshold value based on a stored data counter value and an identified one of a plurality of first and second stored code-length values;

comparing said internal buffer value with said threshold value and generating an expanded binary-decision signal in response to said comparison;

updating said data counter value by subtracting either said current identified first code-length value or said current identified second code-length value, in response to said comparison;

updating said internal buffer value in response to said comparison;

increasing said data counter value and updating said internal buffer value using said internal buffer value and data from said output data in response to the data counter value dropping below a prescribed minimum.

* * * * *